(12) United States Patent
Comard

(10) Patent No.: US 6,706,583 B1
(45) Date of Patent: Mar. 16, 2004

(54) HIGH SPEED LOW NOISE TRANSISTOR

(75) Inventor: Matthew Comard, Woodland Park, CO (US)

(73) Assignee: LSI Logic Corporation, Milpitas, CA (US)

( * ) Notice: Subject to any disclaimer, the term of this patent is extended or adjusted under 35 U.S.C. 154(b) by 305 days.

(21) Appl. No.: 10/008,170

(22) Filed: Oct. 19, 2001

(51) Int. Cl.[7] .......................................... H01L 21/8249
(52) U.S. Cl. ...................................... 438/235; 438/680
(58) Field of Search .......................... 438/94, 191, 204, 438/235, 236, 239, 240–243, 309, 316, 320, 380

(56) References Cited

U.S. PATENT DOCUMENTS

| | | | |
|---|---|---|---|
| 5,106,767 A | * 4/1992 | Comfort et al. ............. | 438/235 |
| 5,340,753 A | * 8/1994 | Bossous et al. ............. | 438/680 |
| 5,620,907 A | * 4/1997 | Jalali-Farahani et al. ... | 438/320 |
| 5,834,800 A | 11/1998 | Jalali-Farahani et al. ... | 257/198 |
| 6,191,021 B1 | * 2/2001 | Fuller et al. ................ | 438/606 |
| 6,426,265 B1 | * 7/2002 | Chu et al. .................... | 438/312 |
| 6,441,462 B1 | * 8/2002 | Lanzeritti et al. ........... | 257/576 |

* cited by examiner

*Primary Examiner*—David Nhu
(74) *Attorney, Agent, or Firm*—Luedeka, Neely & Graham

(57) ABSTRACT

A method for making a heterojunction bipolar transistor on an insulated semiconductor substrate. A highly doped subcollector is formed on an insulated substrate. A lightly doped collector is formed adjacent to and in direct contact with the subcollector. An extrinsic base film stack is deposited on the lightly doped collector. A collector base S and base emitter junction window are etched in the extrinsic base film stack. A doped semiconductor intrinsic base is formed in the junction window. A self aligning base emitter spacer is formed and etched in the junction window and the emitter material is deposited and etched in the junction window. Oxide spacers are deposited and etched adjacent walls of the emitter material. The extrinsic base is defined and conductors are deposited on the device to provide a heterojunction bipolar transistor having improved resistance and capacitance characteristics.

34 Claims, 26 Drawing Sheets

HIGH SPEED LOW NOISE TRANSISTOR

FIELD

The invention relates generally to the field of integrated circuit fabrication and, in particular, to heterojunction bipolar transistors.

BACKGROUND

The addition of germanium to silicon for forming silicon germanium semiconductor devices has provided introduction of heterojunction bipolar transistors which tend to operate at higher speeds than conventional silicon bipolar transistors. However, conventional bipolar transistors typically use a buried subcollector and a low resistivity sinker to reduce the resistance between the collector and the collector conductor on a semiconductor substrate. Deep trench isolation structure are typically used with such devices to reduce peripheral capacitance between the device and the substrate. For example, deep trench isolation structures tend to provide a reduction in the peripheral capacitance between the collector of the bipolar transistor and the substrate. However, the largest contributor to the overall capacitance of the device typically comes from the buried subcollector and the substrate. Deep trench isolation structures are substantially ineffective in reducing the capacitance between the subcollector and the substrate. Sinkers are also typically used with such bipolar transistor devices to connect the subcollector to a conductor region in order to reduce the collector resistance. However, for higher speed lower noise semiconductor devices additional improvements in capacitance and resistance are needed.

SUMMARY

The above and other needs are met by a method for making a heterojunction bipolar transistor on an insulated semiconductor substrate so as to minimize collector resistance and collector to substrate capacitance. A highly doped subcollector is formed in a subcollector region on an insulated substrate, and a collector region is defined adjacent the subcollector region. A lightly doped collector is formed adjacent to and in direct contact with the subcollector. A doped extrinsic base film stack is deposited on the lightly doped collector. The extrinsic base film stack is etched to provide a collector base and base emitter junction window in the extrinsic base film stack. A doped semiconductor intrinsic base is formed in the junction window. A self aligning base emitter spacer is deposited and etched in the junction window. The emitter material is deposited and etched in the junction window, and the emitter has emitter walls. Oxide spacers are deposited and etched adjacent the emitter walls of the emitter material. An extrinsic base is defined and conducting materials are deposited on the emitter and extrinsic base.

According to another aspect of the invention, a subcollector is laterally adjacent at least a portion of a collector so as to be in direct contact with each other. The subcollector and collector are disposed between shallow trench isolation structures on an insulated substrate.

In still another aspect of the invention, a lightly doped collector includes a first portion laterally adjacent a highly doped subcollector and a vertically grown portion adjacent the lateral portion. Both the lateral portion and the subcollector are disposed between shallow trench isolation structures on an insulated substrate.

By having the subcollector and collector in direct adjacent contact with one another, intermediate conducting materials are avoided, thereby preferably reducing the collector resistance. The collector to substrate capacitance is also preferably reduced by forming the bipolar transistor according to the invention on an insulated substrate and providing isolation structures adjacent the subcollector or collector.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the seal views, and wherein.

DETAILED DESCRIPTION

With reference now to FIGS. 1–12, a heterojunction bipolar transistor according to a first aspect of the invention is now described. In each of the embodiments, a substrate 10 is provided. The substrate 10 is preferably a semiconducting material such as silicon, germanium, or a III–V compound such as gallium arsenide, which preferably contains an insulating layer 12 disposed thereon The insulating layer 12 is preferably an oxide. In the case of the substrate 10 being silicon, the insulating layer is preferably a silicon oxide. Layer 12 is preferably grown over the surface of the substrate 10, such as by a thermal oxidation process or may be formed by an oxide implantation process. The oxide layer 12 preferably has a thickness ranging from about ten nanometers to about one hundred nanometers or more, and most preferably about twenty nanometers.

Figure 1:
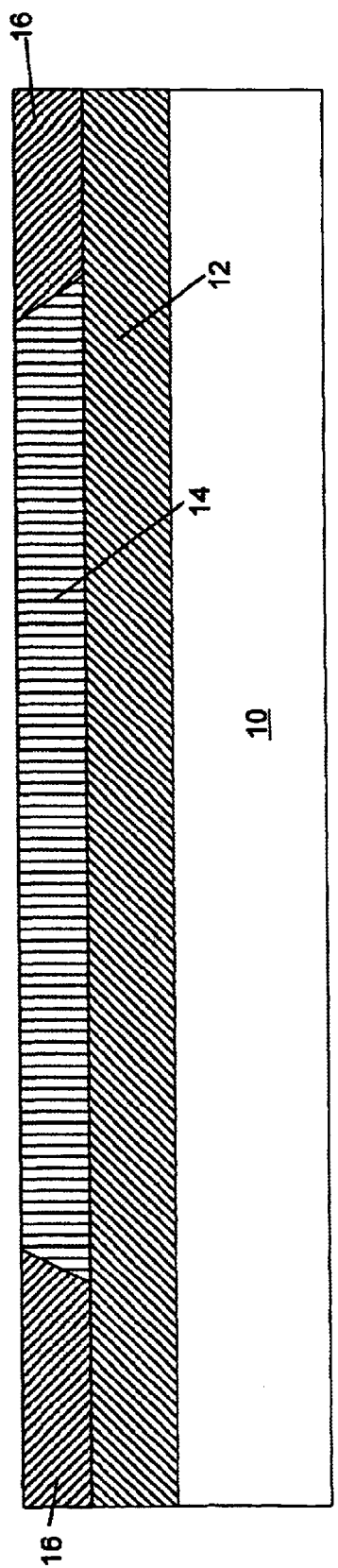
FIG. 1 is a cross sectional side view of an insulated substrate having a highly doped subcollector disposed between shallow trench isolation structures according to the invention.

Next, a layer of semiconducting material is deposited on the insulating layer 12 to provide a subcollector 14 (FIG. 1). Isolation structures such as shallow trench isolation structure 16 are formed adjacent the semiconducting material to electrically isolate the semiconductor material on the substrate. The shallow trench isolation s 16 may be formed by etching the semiconducting material to form trenches and filling the trenches with an electrically insulating material such as an oxide, or by selectively oxidizing portions of the semiconducting material. After forming the isolating structures 16, the semiconducting material is heavily implanted with donor impurities such as arsenic, to provide a highly doped subcollector 14. The highly doped subcollector 14 and trench isolation structures 16 have a thickness which is dependent on the particular design requirements of the complementary metal oxide semiconductor device, and typically has a thickness ranging from about two hundred and fifty nanometers to about seven hundred and fifty nanometers. Most preferably this thickness is shallow enough to form a fully depleted complementary meal oxide semiconductor device. The next step of the process preferably varies according to the configuration of the collector.

Figure 2:
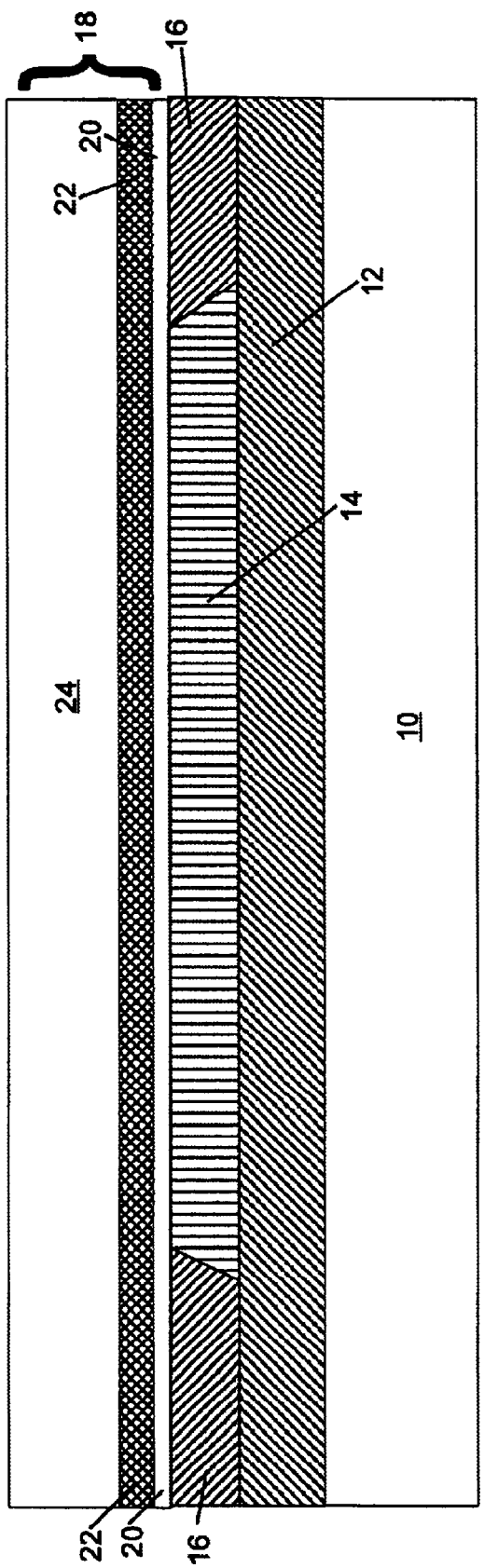
FIG. 2 is a cross sectional side view of an insulated substrate having oxide and nitride layers deposited on a subcollector and isolation structures of a substrate.

In the first embodiment, a collector film stack 18 is provided as shown in FIG. 2. The collector film stack 18 includes a thin oxide layer 20, a first nitride layer 22 and a thick oxide layer 24. The collector film stack is deposited over the subcollector 14 and shallow trench isolation strut 16 by conventional semiconductor processing techniques. The thin oxide layer 20 preferably has a thickness ranging from about thirty nanometers to about seventy nanometers, the first nitride layer 22 preferably has a thickness ranging from about thirty nanometers to about seventy nanometers, and the thick oxide layer 24 preferably has a thickness ranging from about one hundred nanometers to about four hundred nanometers. In the case of a silicon substrate 10 and doped silicon subcollector 14, the oxide of the oxide layers 20 and 24 is preferably a silicon oxide and the nitride of nitride layer 22 is preferably a silicon nitride.

Figure 3:
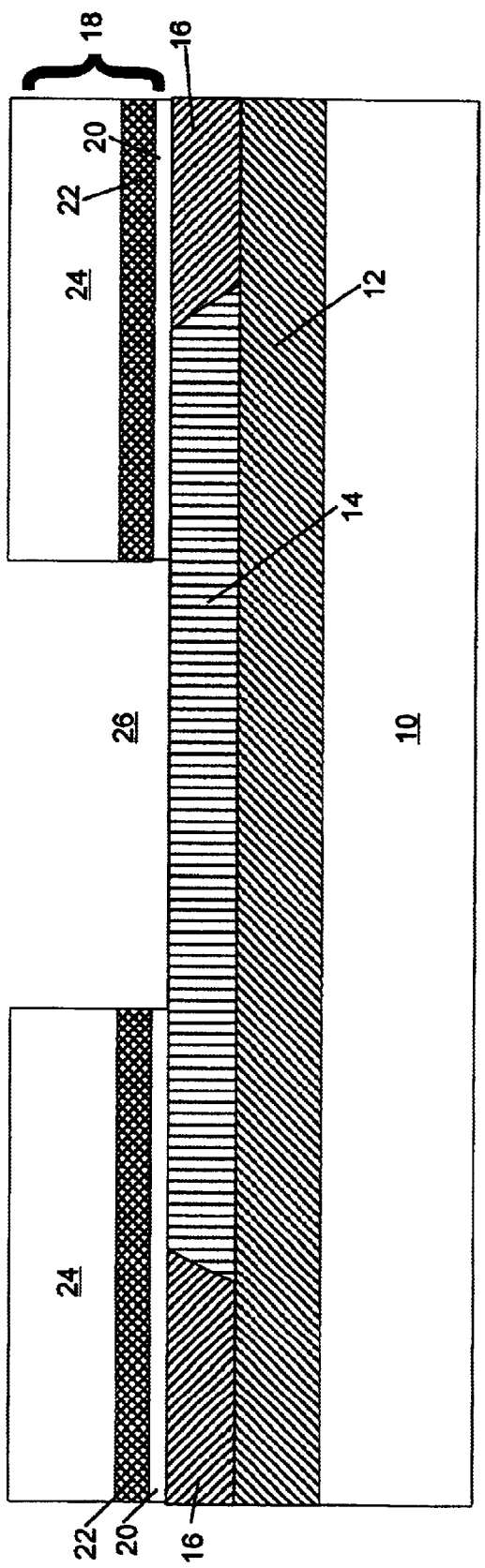
FIG. 3 is a cross sectional side view of a step of etching a collector location in oxide and nitride layers deposited on a substrate.

In order to provide a collector location 26, the thick oxide layer 24, first nitride layer 22 and thin oxide layer 20 of the collector film stack 18 is etched down to the subcollector 14 as shown in FIG. 3. The thick oxide layer 24 and first nitride layer 22 are preferably etched using an anisotropic etching technique and the thin oxide layer 20 is preferably etched using a selective isotropic etching technique such as a wet etch using hydrofluoric acid to remove the thin oxide layer 20 without significantly etching the subcollector 14.

Figure 4:
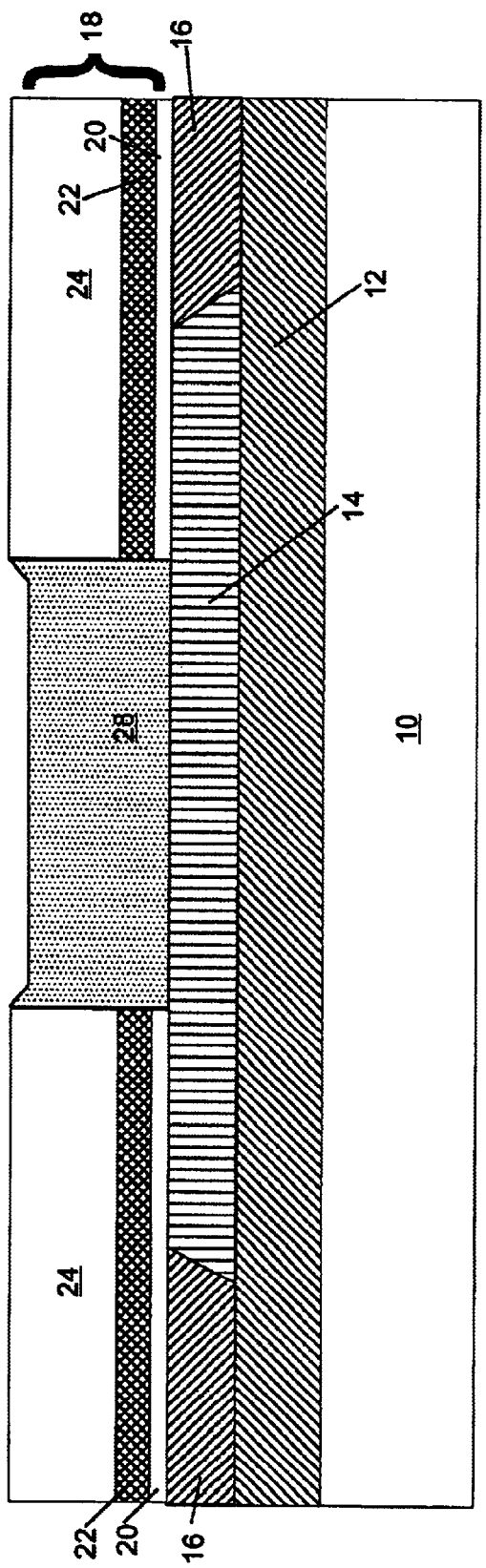
FIG. 4 is a cross sectional side view of a collector grown in a collector location on a semiconductor substrate according to the invention.

A collector 28 is formed as depicted in FIG. 4. The collector 28 in this embodiment is preferably a lightly doped semiconductor material of the same polarity as the subcollector 14, and is preferably formed by a molecular beam homoepitaxial growth technique to provide a vertical collector 28. The collector 28 is preferably adjacent to and in direct contact with the subcollector 14. In the first embodiment, the collector 28 preferably has a thickness ranging from about two hundred nanometers to about five hundred nanometers.

Figure 5:
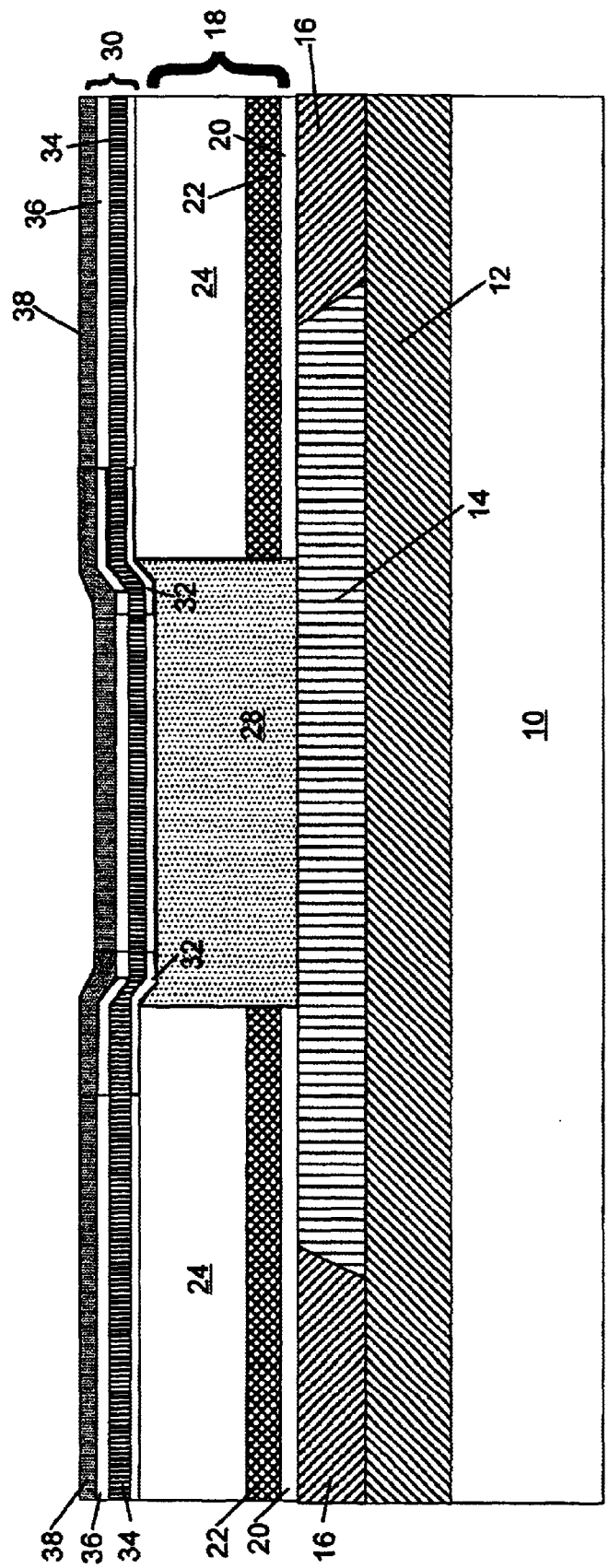
FIG. 5 is a cross sectional side view of an extrinsic base film stack deposited on a collector and oxide layer of a semiconductor substrate.

An oppositely doped extrinsic base film stack 30 is deposited on the collector 28 and remaining collector film stack 18 as shown in FIG. 5. The extrinsic base film stack 30 includes a first thin oxide layer 32, a doped semiconductor layer 34, a second thin oxide layer 36 and a second nitride layer 38. The oxide layers 32 and 36 have a thickness preferably ranging from about thirty nanometers to about seventy nanometers. The doped semiconductor layer 34 preferably has a thickness ranging from about one hundred nanometers to about thee hundred nanometers. The second nitride layer preferably has a thickness raging from about one hundred and fifty nanometers to about two hundred and fifty nanometers. Conventional semiconductor processing techniques may be used to form the extrinsic base film stack 30. The doped semiconductor layer 34 is preferably doped with an oppositely charged doping material from the collector 28, most preferably boron, or boron in combination with germanium, such as in boron doped poly silicon germanium.

Figure 6:
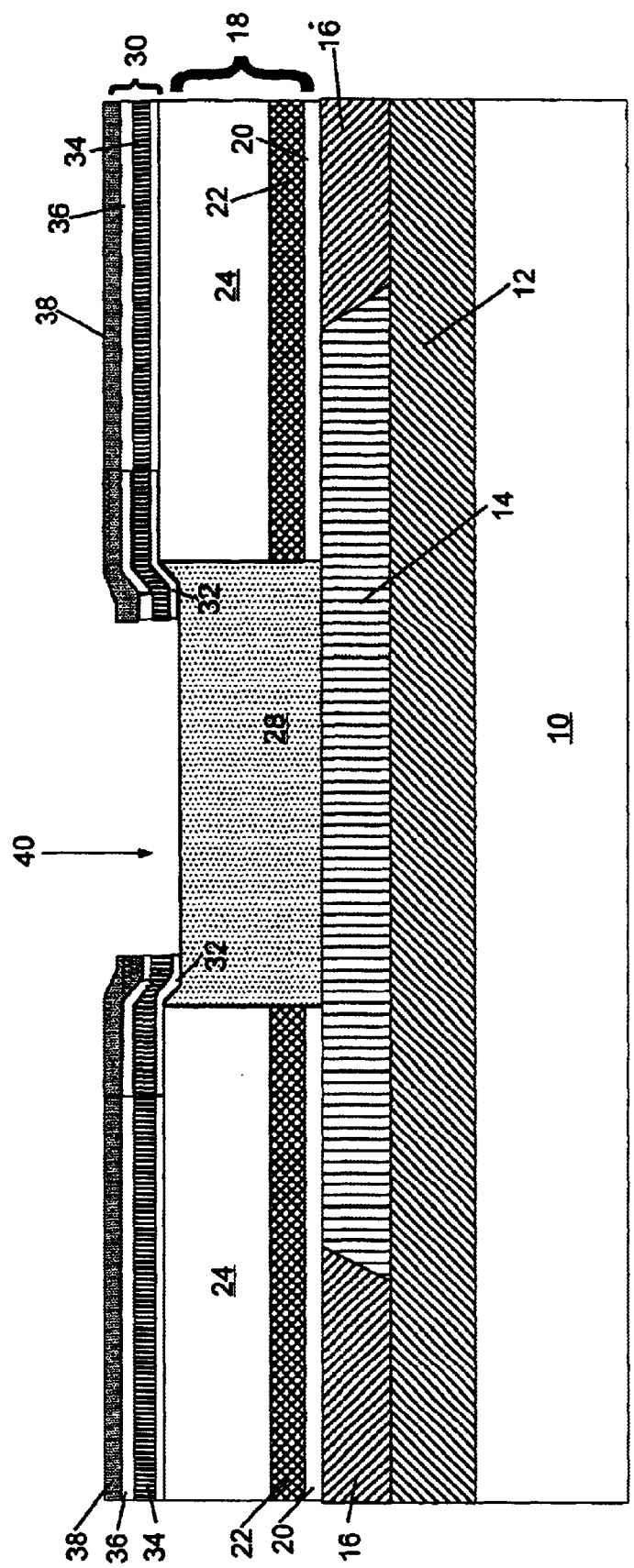
FIG. 6 is a cross sectional side view of an etched window in an extrinsic base film stack of a semiconductor substrate.
Figure 7:
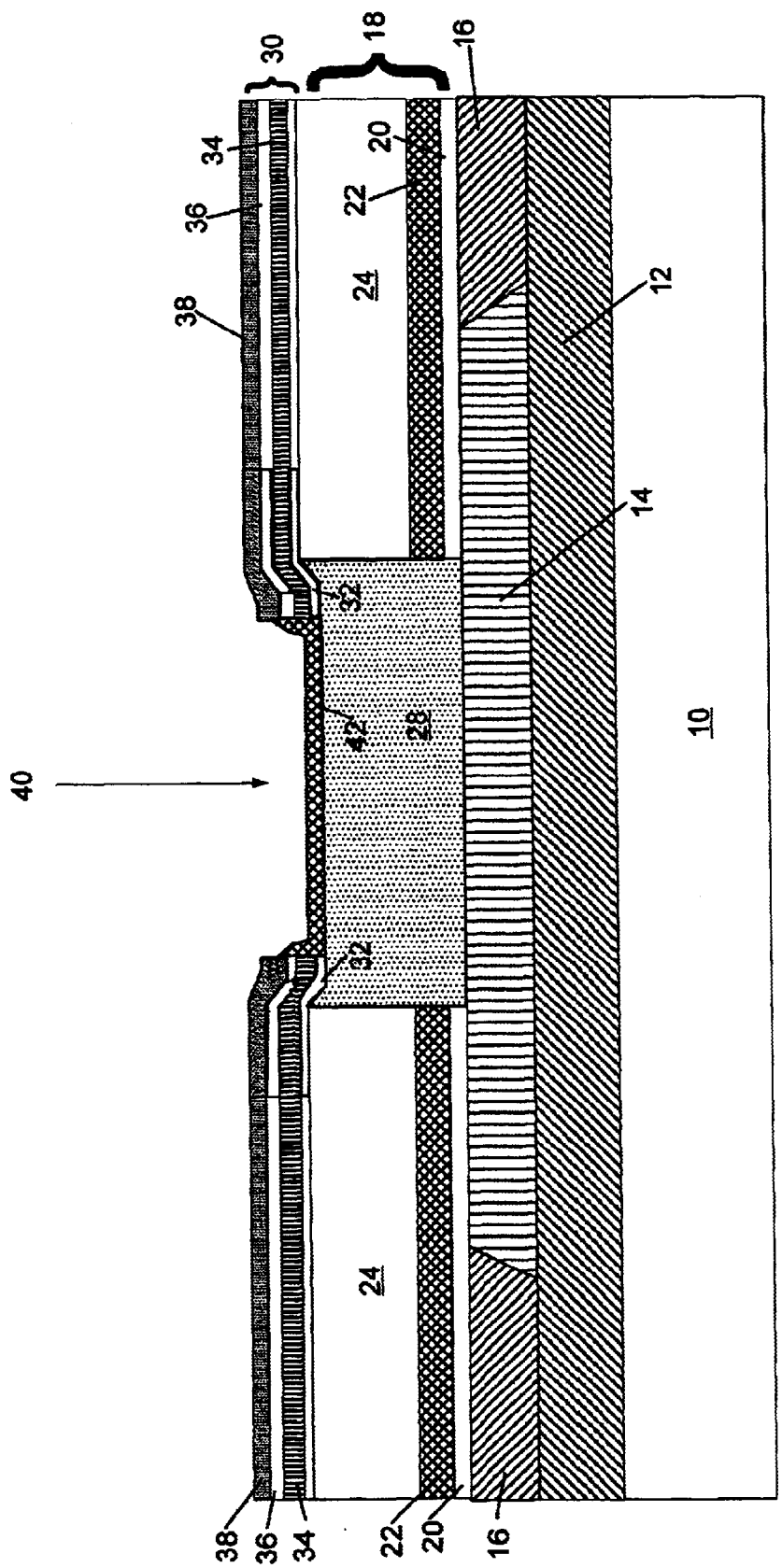
FIG. 7 is a cross sectional side view of an etched window containing a heteroepitaxially grown base for a bipolar transistor structure according to the invention.

A self aligning collector/base and base/emitter junction window 40 is etched through the extrinsic base film slack 30 to provide a location for depositing the base 42 and emitter materials (FIG. 6). Etching is preferably conducted by conventional plasma and chemical etching techniques through layers 32, 34, 36 and 38 so that the base 42, as depicted in FIG. 7, is in direct contact with the collector 28. The base 42 is preferably a doped heterogeneous semiconductor material which is preferably grown by a heteroepitaxial growth technique. In a preferred embodiment, the base 42 is preferably a boron doped silicon germanium alloy base 42. The silicon germanium alloy base 42 has a thickness preferably ranging from about thirty nanometers to about one hundred nanometers, and the germanium content of the base 42 preferably ranges from about five weight percent to about twenty weight percent.

Figure 8:
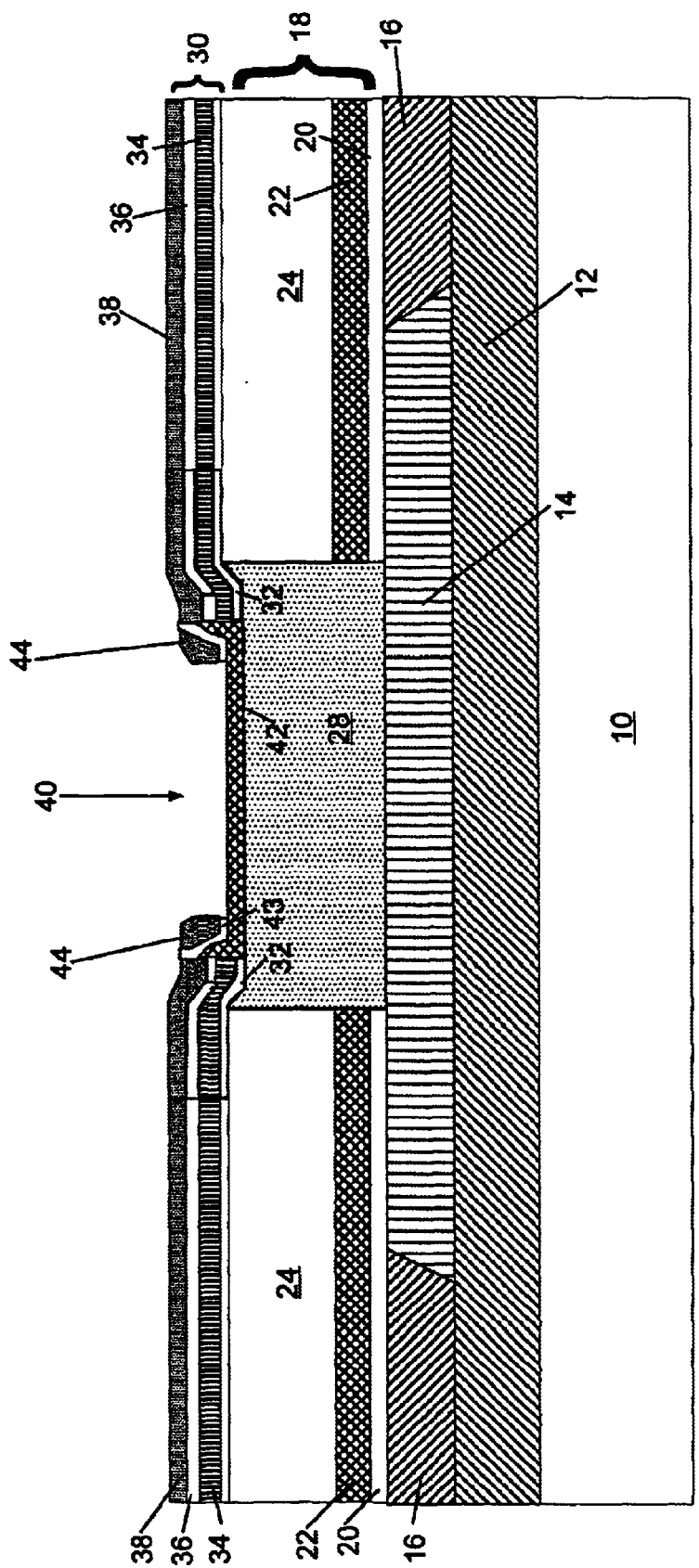
FIG. 8 is a cross sectional side view of a step of depositing and etching self aligning base emitter spacers according to the invention.

A third thin oxide layer 43 is deposited on the nitride layer 38 and base 42, and a passivation or electrically insulating layer is deposited on the third thin oxide layer 43 to provide self aligning base emitter spacers 44, as depicted in FIG. 8. The spacers 44 are provided by etching the second passivation or insulating layer to remove all of the passivation or insulating layer except for the spaces 44 provided in window 40. The exposed oxide layer 43 is removed such as by a wet etch technique from all areas to provide the spacer 44 structure, disposed adjacent the base 42. The base emitter spacers 44 are preferably formed of an insulating material such as nitride, preferably silicon nitride.

Figure 9:
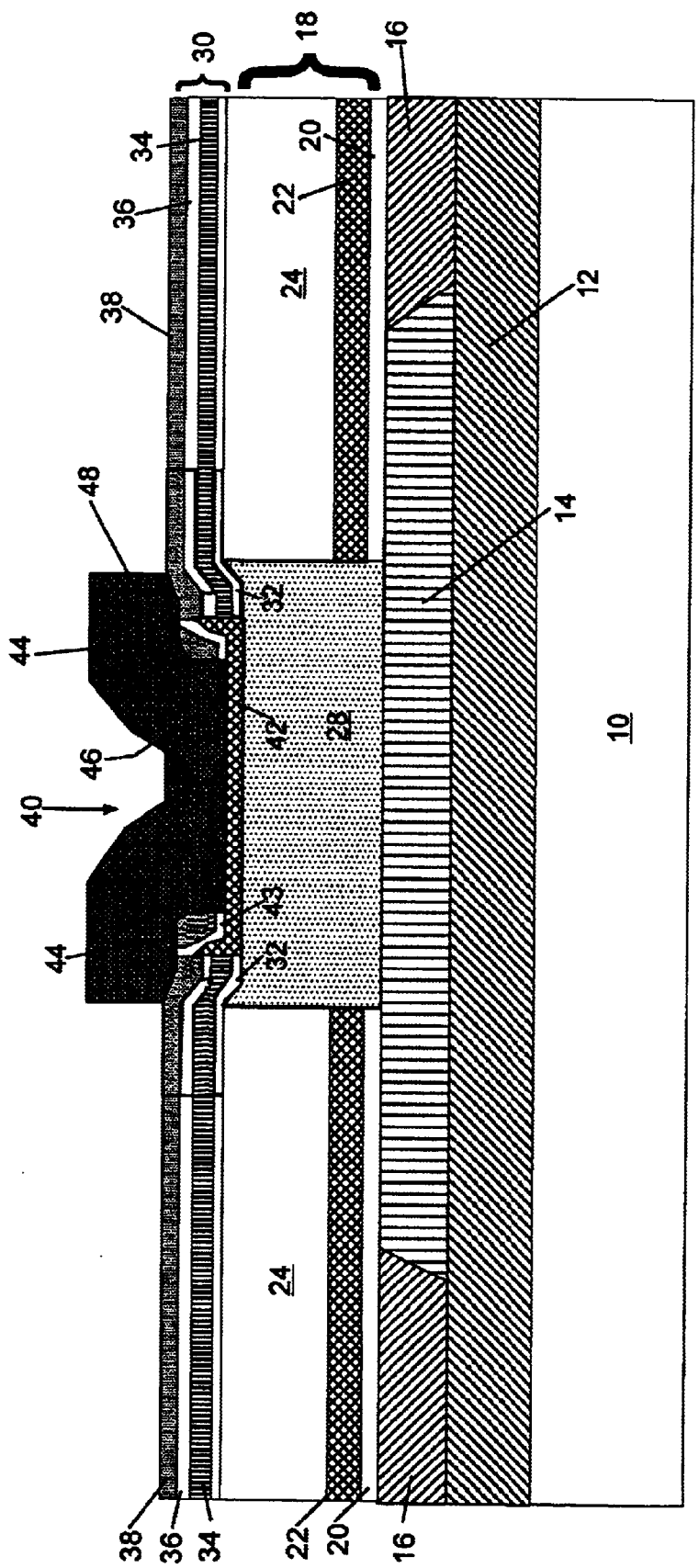
FIG. 9 is a cross sectional side view of a step of depositing and etching a polysilicon emitter on a substrate according to the invention.

A semiconductor emitter material is deposited in the collector base and base emitter junction window 40 and on the second nitride layer 38 to provide the emitter 46 for the transistor, as depicted in FIG. 9. The semiconductor material for the emitter 46 is preferably an n type polysilicon material that is deposited with a thickness ranging from about one hundred and fifty nanometers to about two hundred and fifty nanometers. The amount of doping of the polysilicon material to form the emitter 46 preferably ranges from about $10^{20}$ atoms per cubic centimeter to about $10^{21}$ atoms per cubic centimeter. Dopants include arsenic. The polysilicon material is masked and etched to provide emitter side walls 48 as shown in FIG. 9.

Figure 10:
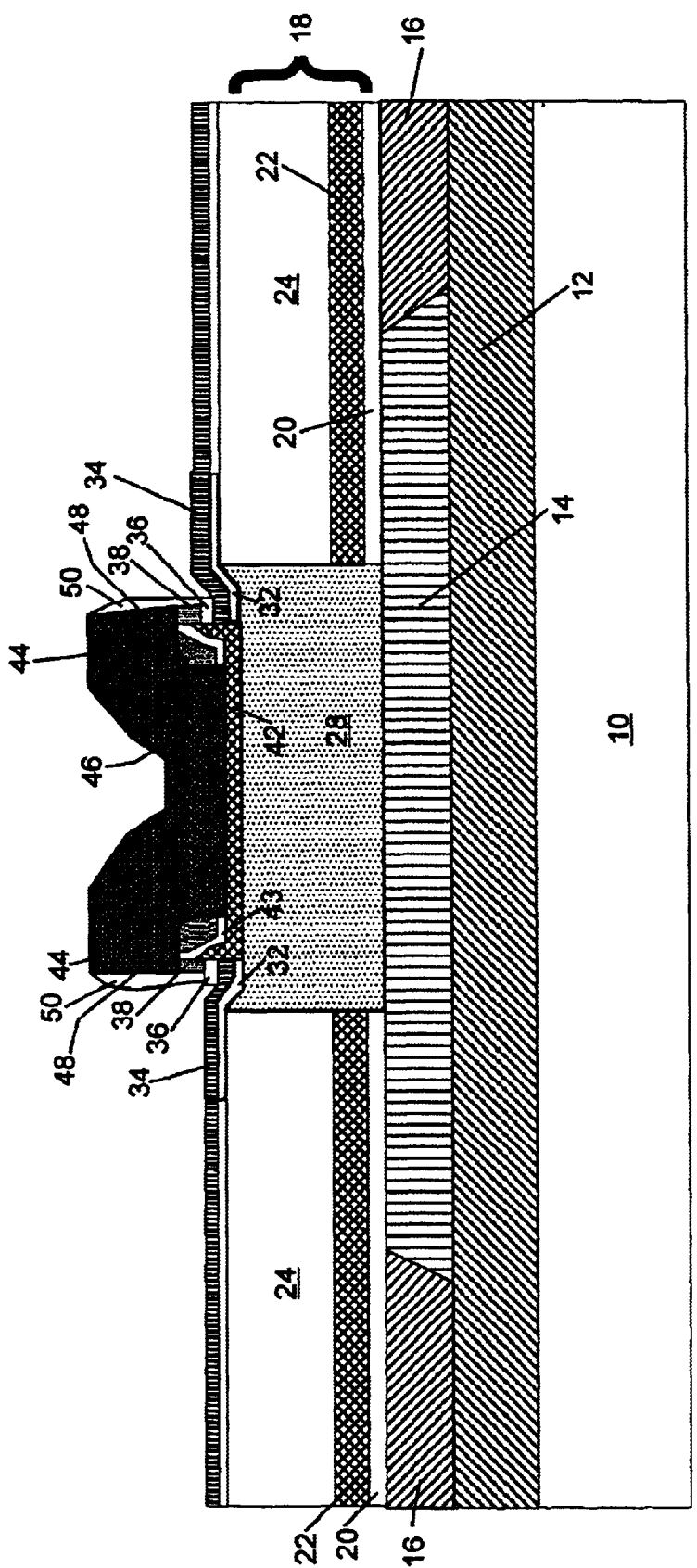
FIG. 10 is a cross sectional side view of oxide spacer deposited on walls of a polysilicon emitter according to the invention.

The exposed second nitride layer 38 is etched down to the second thin oxide layer 36. An oxide layer is deposited and etched to form oxide spacers 50 on the emitter walls 48, and any remaining exposed portions of the second thin oxide layer 36 are wet etched down to the doped semiconducting layer 34 as shown in FIG. 10.

Figure 11:
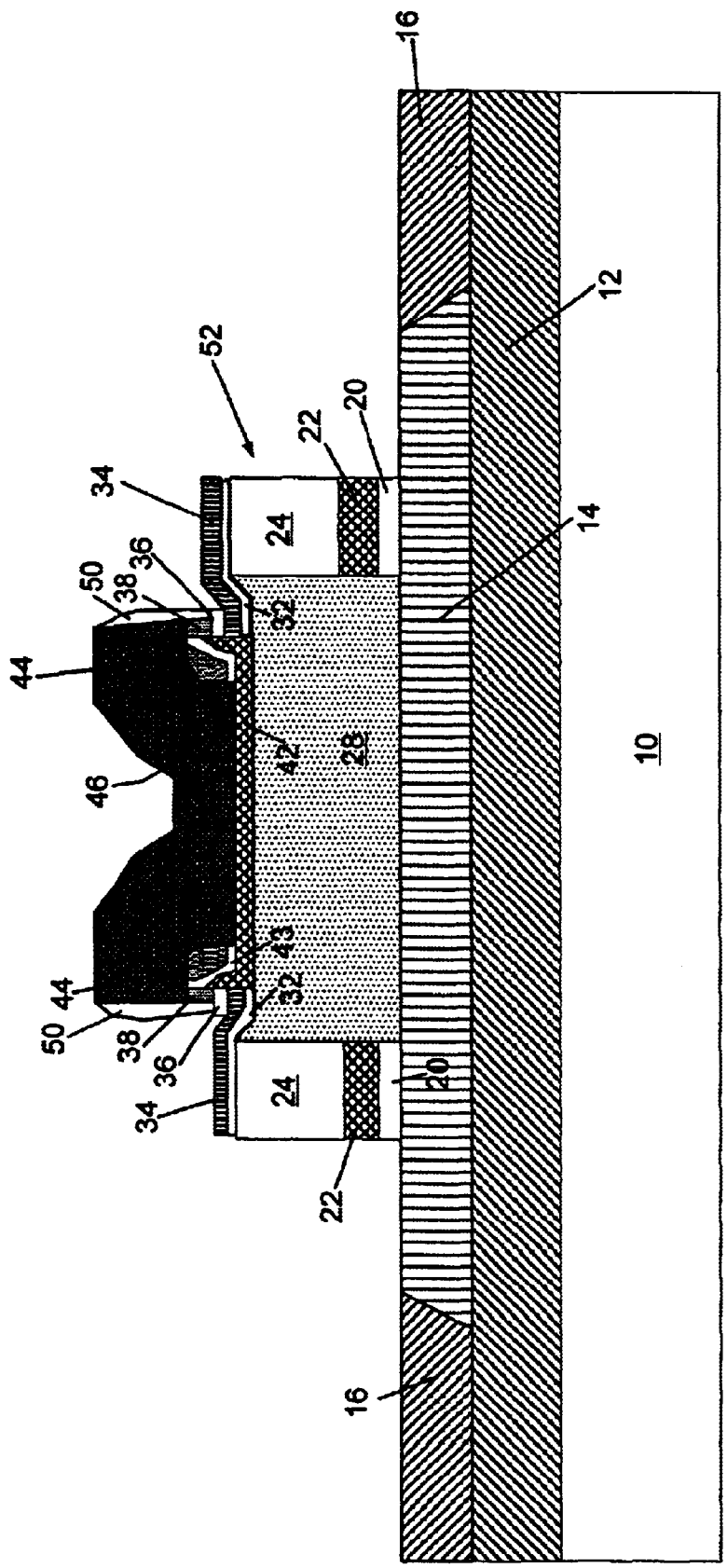
FIG. 11 is a cross sectional side view of an etching step to define a bipolar transistor according to the invention.
Figure 12:
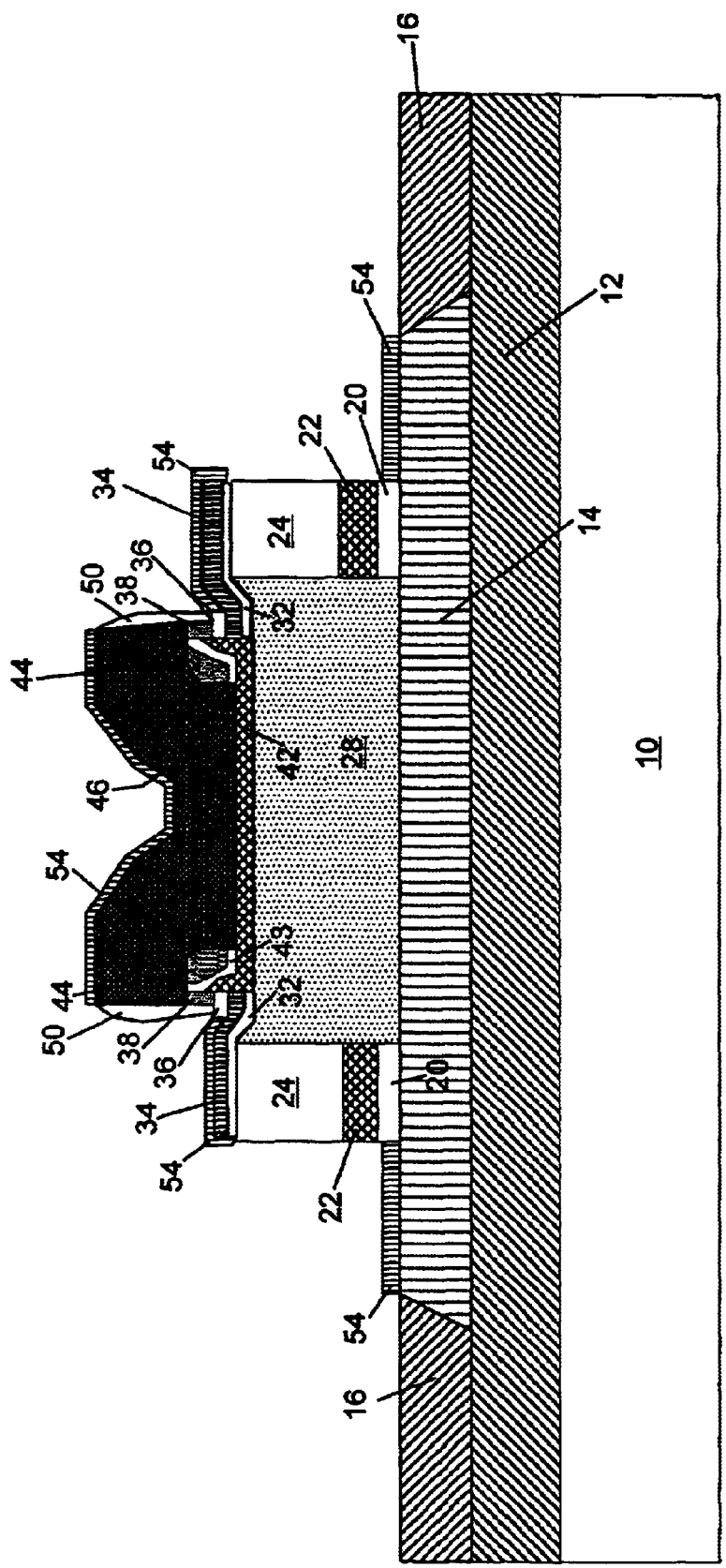
FIG. 12 is a cross sectional side view of a metal deposition step to define electrical contacts according to the invention.

As depicted in FIG. 11, an extrinsic base 52 is preferably defined by masking and dry etching the doped semiconducting layer 34, fist thin oxide layer 32 and the thick oxide layer 24. The first nitride layer 22 is removed such as by chemical etching and the thin oxide layer 20 is removed such as by wet or dry etching. Exposed portions of the emitter 46, doped semiconducting layer 34 and subcollector 14 are then silicided to provide areas 54 for contact with electrical conductors of the semiconductor device, as depicted in FIG. 12.

To provide the silicided areas 54, the exposed surfaces are preferably cleaned, such as with hydrofluoric acid, and a refractory metal layer is deposited on the emitter 46, semiconducting layer 34, and exposed portions of the subcollector 14. The metal layer is preferably formed of a metal selected from the group consisting of titanium, tungsten, nickel, cobalt, or any other metallic material or combination of such that is compatible with the materials, functions, and processes described herein. The refractory metal layer may be applied to the emitter 46, semiconducting layer 34, and subcollector 14 such as by sputtering or chemical vapor deposition.

After depositing the refractory metal layer, the layer is annealed to react the metal layer with the semiconducting material in the emitter 46, semiconducting layer 34, and subcollector 14 to form the metal silicide 54. In the preferred embodiments where the material of the emitter 46, semiconducting layer 34, and subcollector 14 is polysilicon, the metal silicides that are formed preferably include but are not limited to tungsten silicide, titanium silicide, nickel silicide and cobalt silicide. In a particularly preferred embodiment of the invention, the emitter 46 and the semiconducting layer 34 are formed of doped polysilicon, the subcollector is doped monocrystalline silicon, the refractory metal layer is cobalt, and the metal silicide 54 is cobalt silicide.

In an alternate embodiment, the invention provides a heterojunction bipolar transistor having a collector with a vertically grown portion as described above, where at least a portion of the collector is in lateral contact with a subcollector. FIGS. 1 and 13–22 illustrate a process according to a second embodiment of the invention As set forth above, the staring point for each of the embodiments is a substrate 10 containing an insulating layer 12 and a semiconducting layer 14 disposed between isolation structures 16, providing an island of semiconducting material 14, as shown in FIG. 1.

Figure 13:
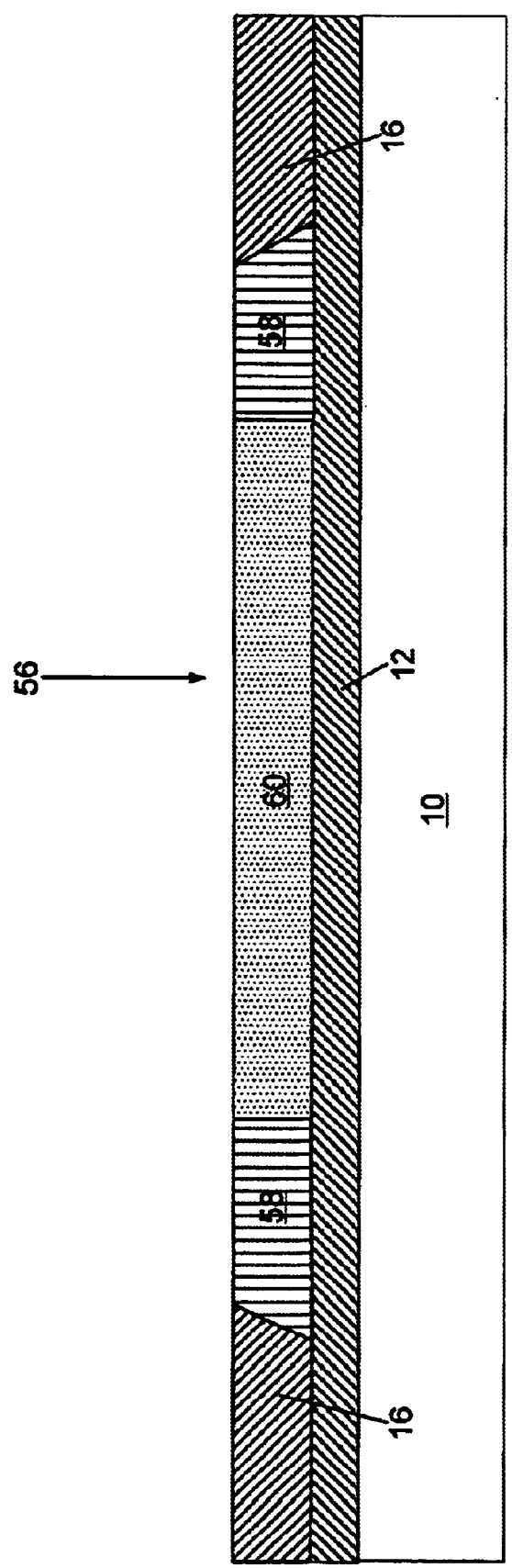
FIGS. 13–22 are cross sectional side views of an alternative process for making a bipolar transistor according to the invention, the transistor having a lateral collector portion and a vertical collector portion.

The collector region 56 is masked and subcollectors 58 are formed by heavily implanting a dopant in the semiconducting material 14 (FIG. 13). The collector region 56 is lightly doped to provide a lateral collector portion 60 that is adjacent to and in lateral contact with the subcollectors 58. All other aspects of the subcollector 58, insulating layer 12, and substrate 10 are preferably formed as described above with respect to the first embodiment of the invention.

Figure 14:
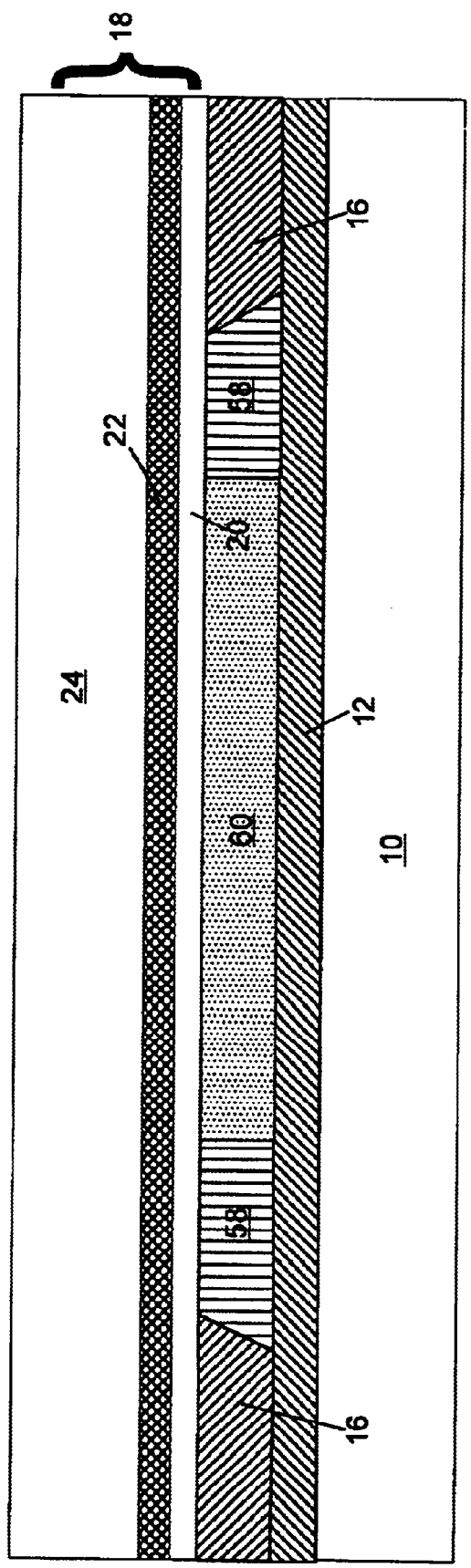

A collector film stack 18 is provided as shown and described with respect to FIG. 14. The collector film stack 18 includes a thin oxide layer 20, a first nitride layer 22 and a thick oxide layer 24. The collector film stack is preferably deposited over the lateral collector portion 60, subcollectors 58, and shallow trench isolation structures 16 by conventional semiconductor processing techniques. The thin oxide layer 20 preferably has a thickness ranging from about thirty nanometers to about seventy nanometers, the first nitride layer 22 preferably has a thickness ranging from about thirty nanometers to about seventy nanometers, and the thick oxide layer 24 preferably has a thickness ranging from about fifty nanometers to about two hundred nanometers. In the preferred embodiment of a silicon substrate 10 and doped silicon subcollector 58, the oxide of the oxide layers 20 and 24 is preferably a silicon oxide and the nitride of nitride layer 22 is preferably a silicon nitride.

Figure 15:
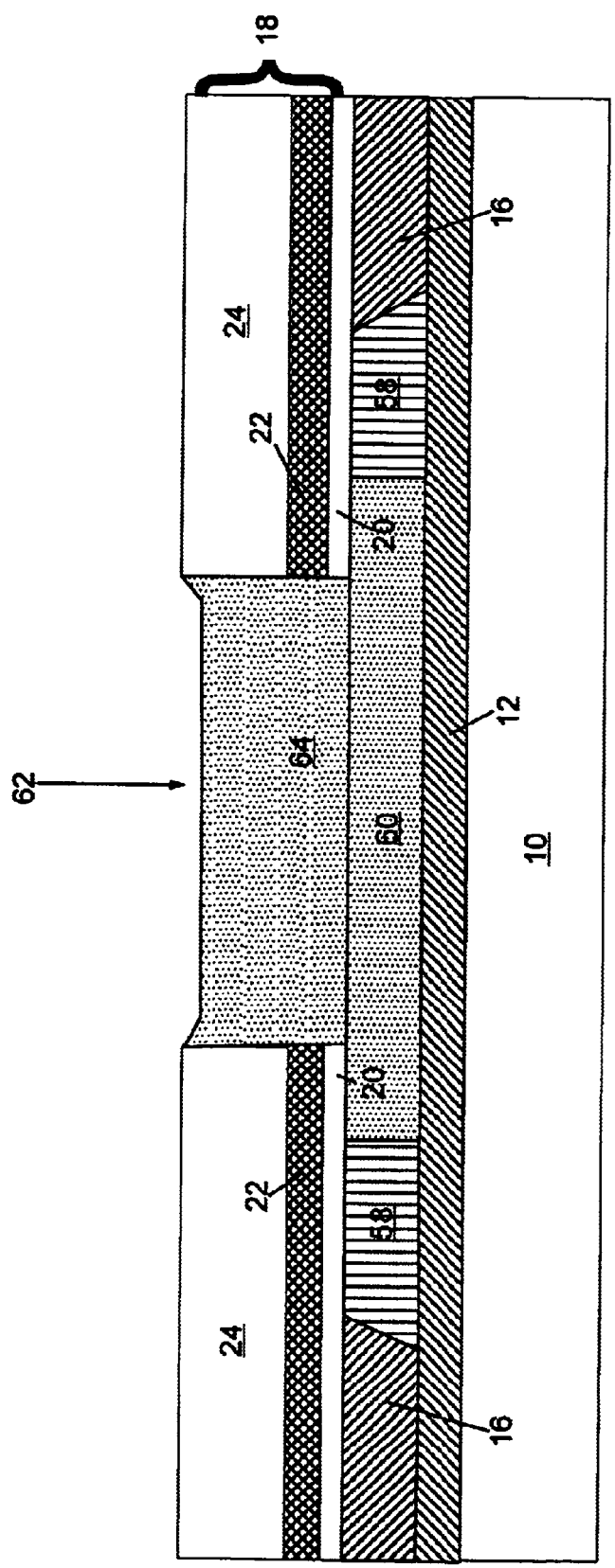

To provide a collector location 62 for a vertical collector portion 64, as depicted in FIG. 15, the thick oxide layer 24, first nitride layer 22, and thin oxide layer 20 of the collector film stack 18 is etched down to the lateral collector portion 60. The thick oxide layer 24 and first nitride layer 22 are preferably etched using an anisotropic etching technique and the thin oxide layer 20 is preferably etched using a selective isotropic etching technique such as a wet etch with hydrofluoric acid, to remove the thin oxide layer 20 without significantly etching the lateral collector portion 60.

Like the lateral collector portion 60, the vertical collector portion 64 is preferably formed of a lightly doped semiconductor material of the same polarity as the subcollector 58, and is most preferably formed such as by a molecular beam homoepitaxial growth technique. As shown in FIG. 15, the lateral collector portion 60 is preferably adjacent to and in direct contact with the subcollector 58 and the vertical collector portion 64 is grown directly on the lateral collector portion 60. In this embodiment, the vertical collector portion 64 preferably has a thickness ranging from about one hundred nanometers to about two hundred and fifty nanometers.

Figure 16:
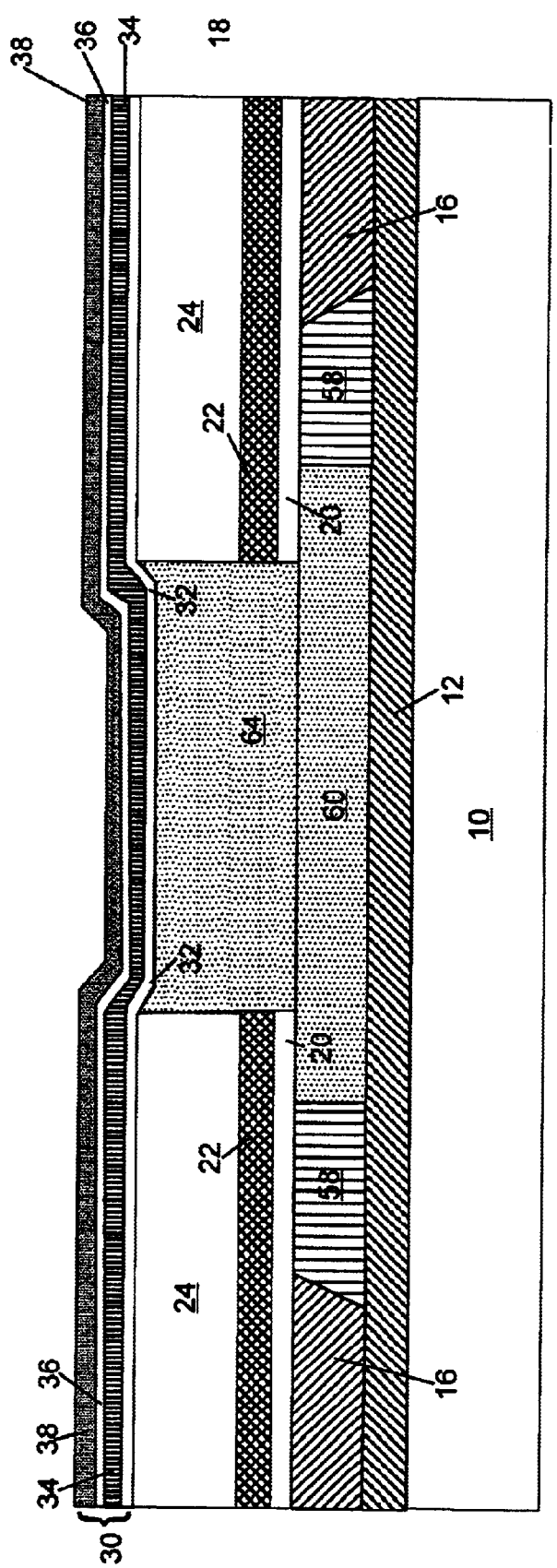

An oppositely doped extrinsic base film stack 30 is deposited on the vertical collector portion 64 and remaining collector film stack 18 as shown in FIG. 16. The extrinsic base film stack 30 includes a first thin oxide layer 32, a doped semiconductor layer 34, a second thin oxide layer 36 and a second nitride layer 38. The oxide layers 32 and 36 have a thickness preferably ranging from about thirty nanometers to about seventy nanometers. The doped semiconductor layer 34 preferably has a thickness ranging from about one hundred nanometers to about three hundred nanometers. The second nitride layer 38 preferably has a thickness ranging from about one hundred and fifty nanometers to about two hundred and fifty nanometers. Conventional semiconductor processing techniques may be used to form the extrinsic base film stack 30. The doped semiconductor layer 34 is preferably doped with an doping material that is oppositely charged from the collector 64, most preferably boron, or boron doped poly silicon germanium.

Figure 17:
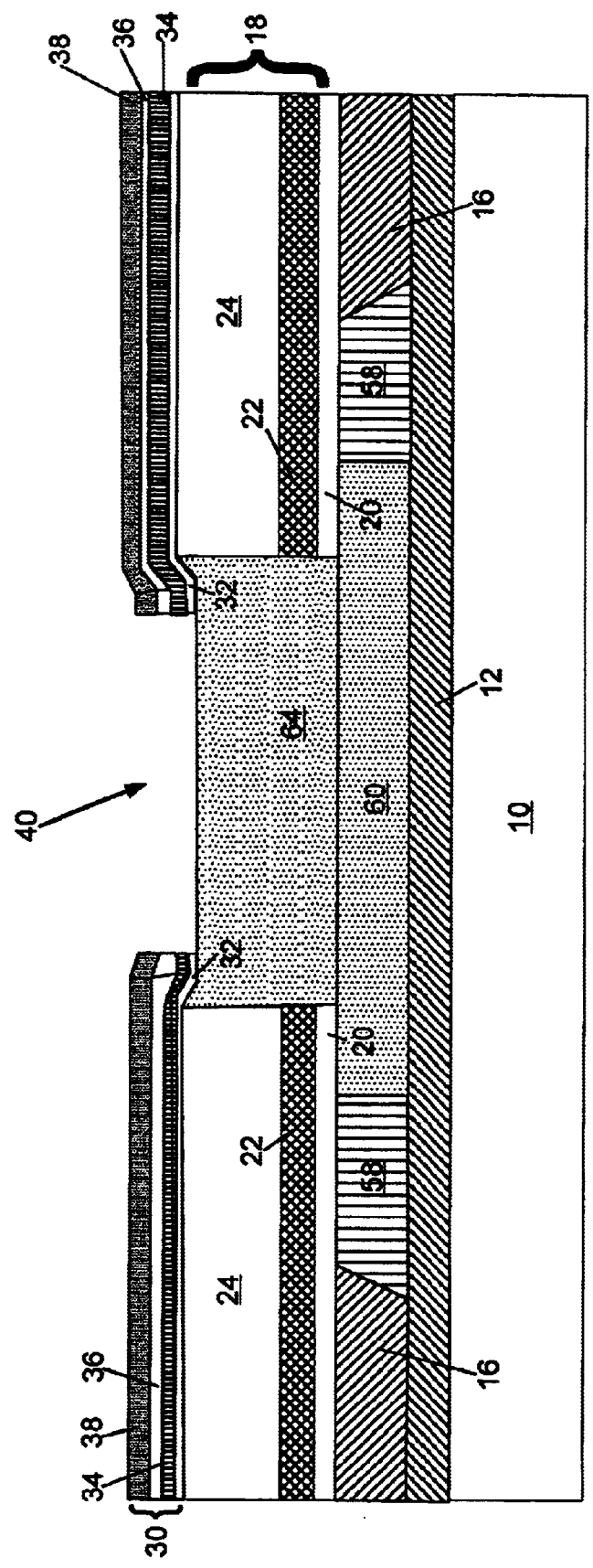
Figure 18:
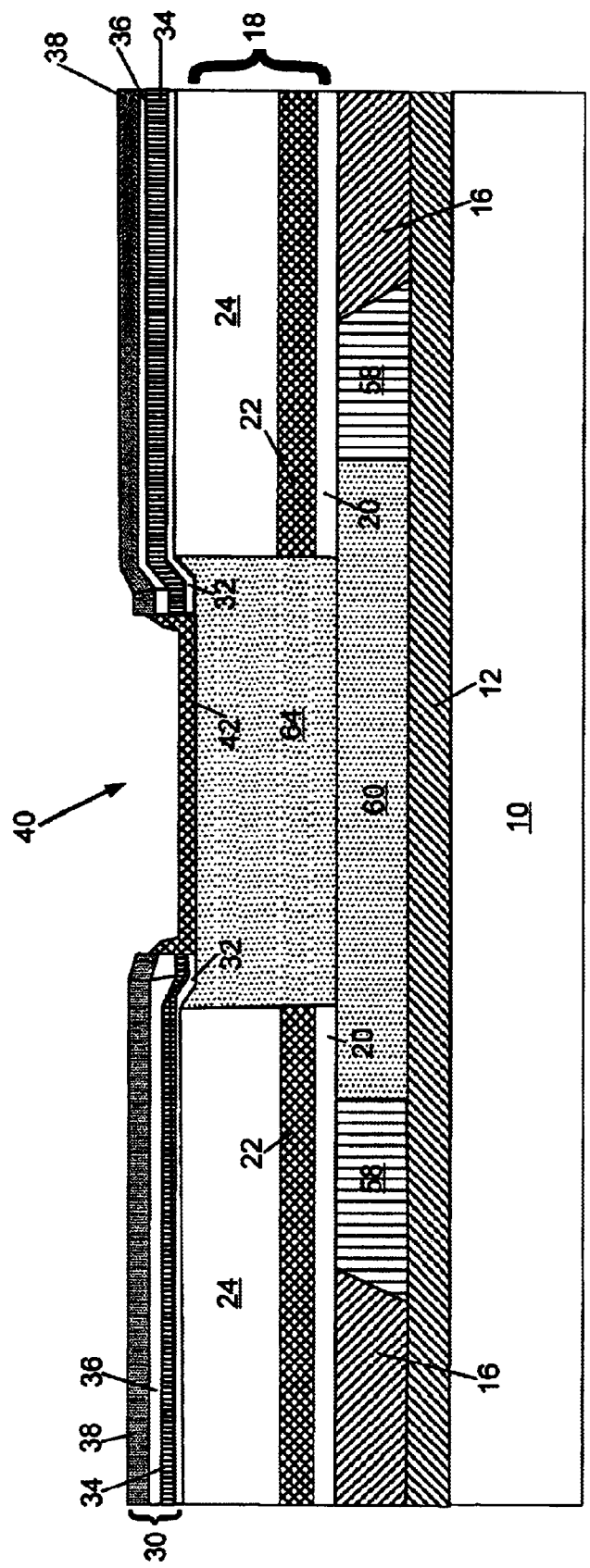

A self aligning collector base and base emitter junction window 40 is etched through the extrinsic base film stack 30 to provide a location for depositing the base 42 and emitter materials (FIG. 17). Etching is preferably conducted such as by conventional plasma and chemical etching techniques through layers 32, 34, 36 and 38, so that the base 42 to be formed is in direct contact with the vertical collector portion 64, as depicted in FIG. 18. The base 42 is preferably a doped heterogeneous semiconductor material which is preferably grown by a heteroepitaxial growth technique. In a preferred embodiment, the base 42 is preferably a boron doped silicon germanium alloy base 42. The silicon germanium alloy base 42 preferably has a thickness ranging from about thirty nanometers to about one hundred nanometers, and the germanium content of the alloy base 42 preferably ranges from about five weight percent to about twenty weight percent.

Figure 19:
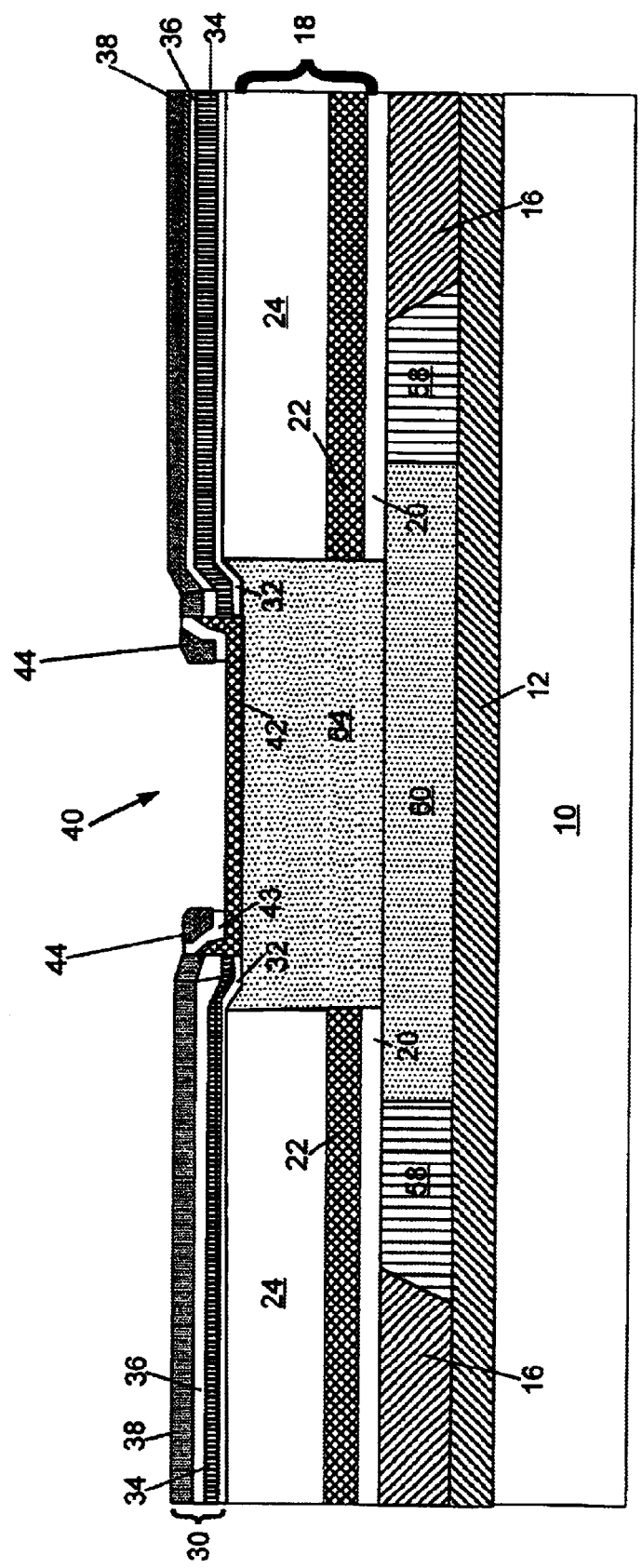

A third thin oxide layer 43 is deposited on the nitride layer 38 and base 42, as depicted in FIG. 19, and a passivation or electrically insulating layer is deposited on the third thin oxide layer 43 to provide self aligning base emitter spacers 44. The spacers 44 are provided by etching the second passivation or insulating layer to remove all of the passivation or insulating layer except for the spacers 44 provided in window 40. The exposed portions of the third thin oxide layer 43 are removed such as by a wet etch technique to provide the spacer 44 structures shown in FIG. 19 adjacent the base 42. The base emitter spacers 44 are preferably formed of an insulating material such as nitride, preferably silicon nitride.

Figure 20:
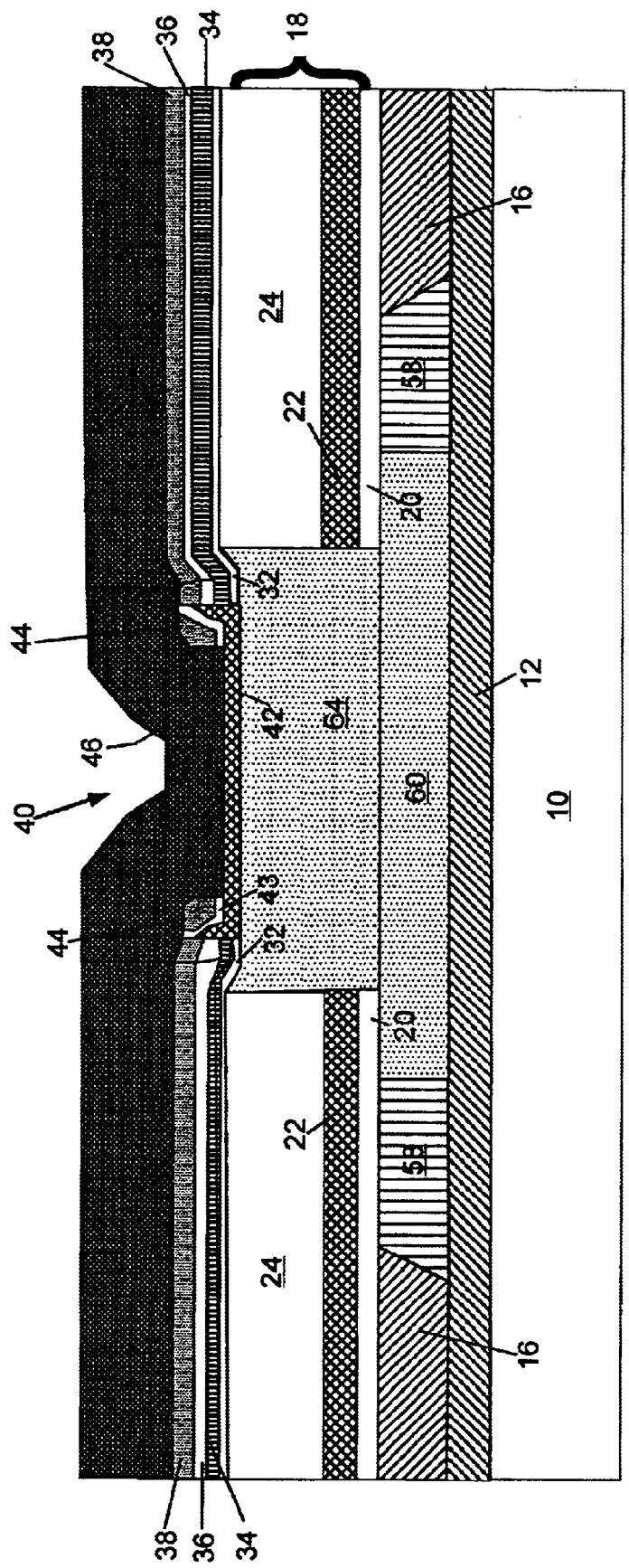

A semiconductor emitter material is deposited in the collector base and base emitter junction window 40 and on the second nitride layer 38 to provide the emitter 46 for the transistor (FIG. 20). The semiconductor material for the emitter 46 is preferably an type polysilicon material that is deposited on the second nitride layer 38 with a thickness ranging from about one hundred and fifty nanometers to about two hundred and fifty nanometers. The amount of doping of the polysilicon material to form the emitter 46 preferably ranges from about $10^{20}$ atoms per cubic centimeter to about $10^{21}$ atoms per cubic centimeter. Dopants preferably include arsenic.

Figure 21:
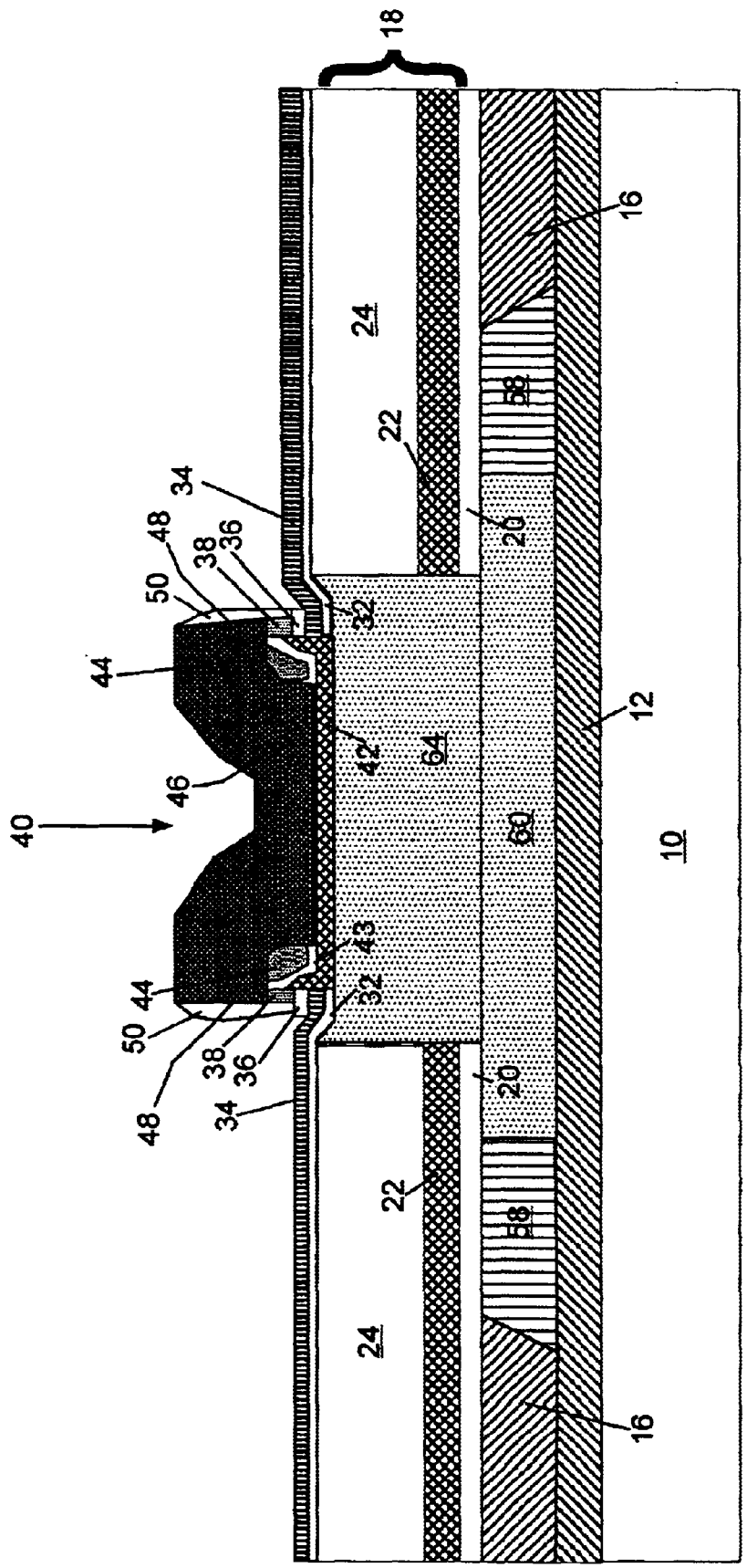

The polysilicon material of the emitter 46 is masked and etched to provide emitter side walls 48 as shown in FIG. 21, and the exposed second nitride layer 38 is etched down to the second thin oxide layer 36. An oxide layer is deposited and etched to form oxide spacers 50 on the emitter walls 48, and any remaining exposed residual portions of the second thin oxide layer 36 are preferably wet etched to expose the doped semiconducting layer 34, similar to that as described above.

Figure 22:
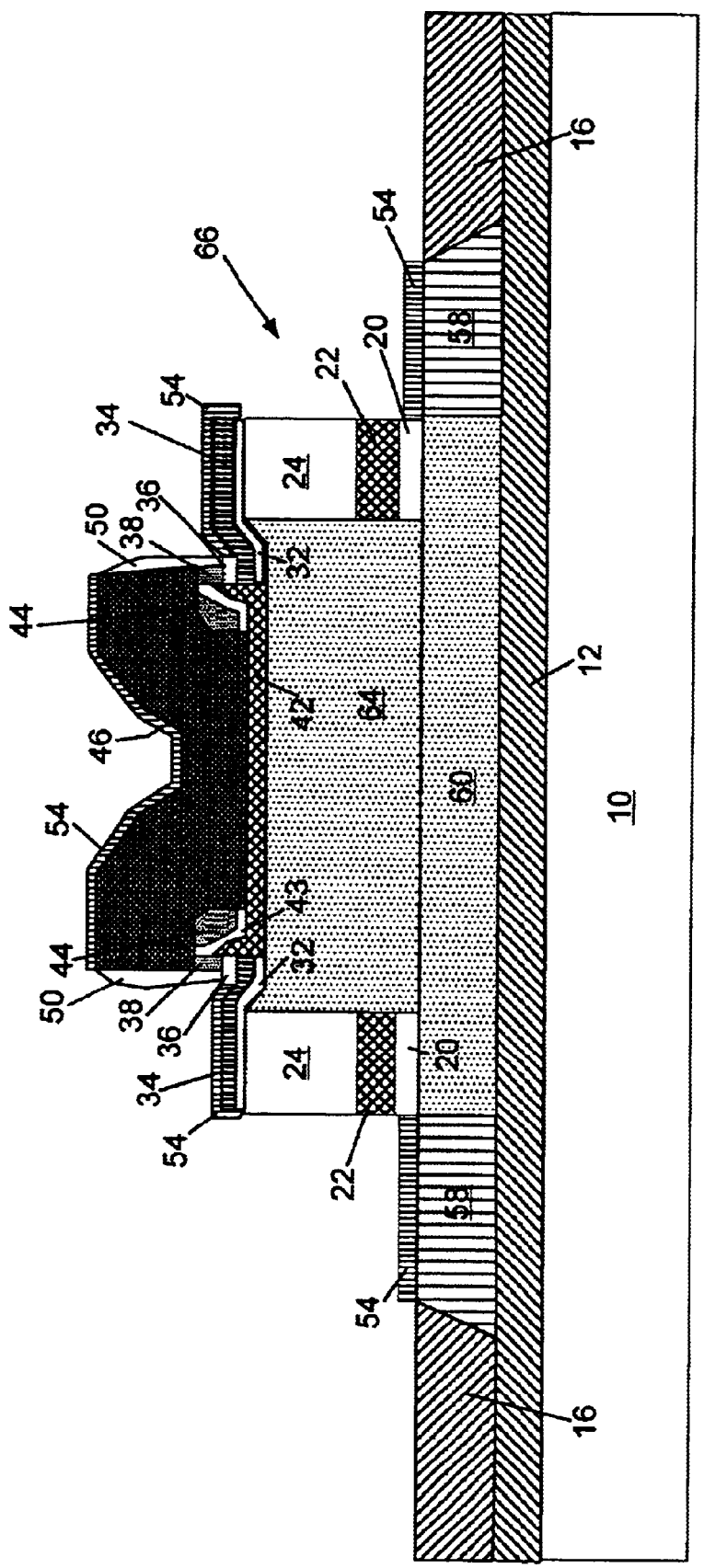
Figure 23:
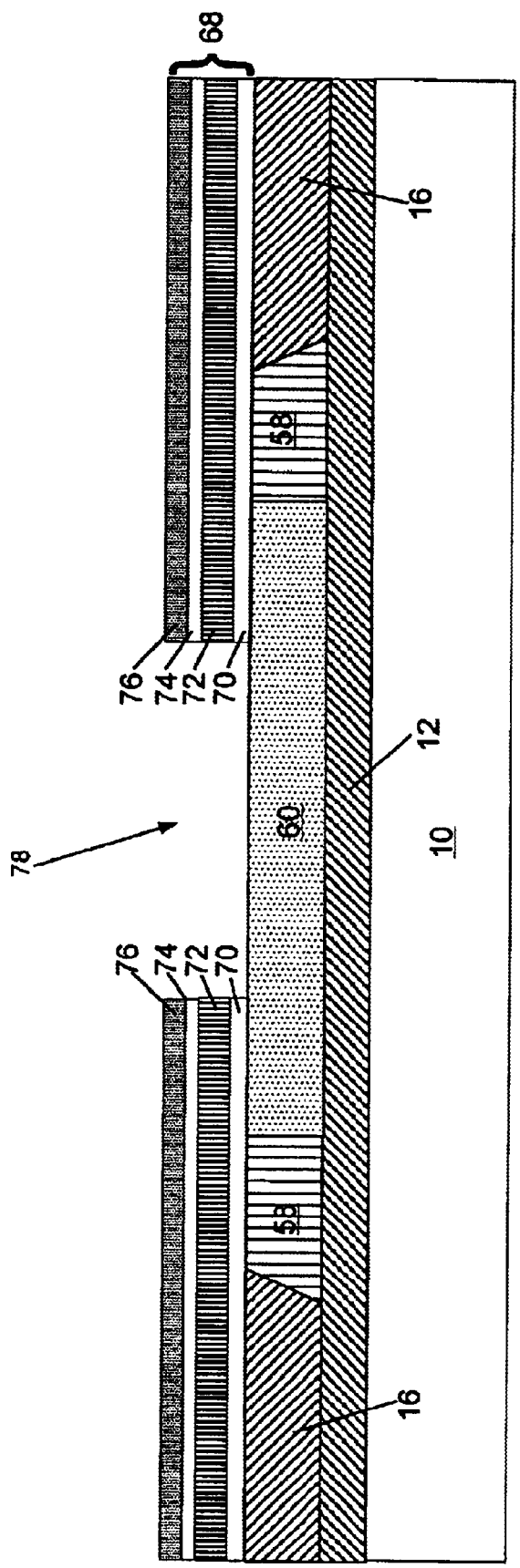
FIGS. 23–26 are cross section side views of another alternative process for making a bipolar transistor according to the invention, the transistor having a lateral collector portion adjacent a subcollector on an insulated substrate.

An extrinsic base 66 is preferably defined such as by masking and dry etching the doped semiconducting layer 34, first thin oxide layer 32, and the thick oxide layer 24. The first nitride layer 22 is preferably removed such as by chemical etching, and the thin oxide layer 20 is preferably removed such as by wet or dry etching. Exposed portions of the emitter 46, doped semiconducting layer 34, and subcollector 58 are preferably silicided similar to that as described above to provide metal silicide 54 layers for connection to conductors, as depicted in FIG. 22.

A further embodiment of the invention is illustrated with reference to FIGS. 23–26. In this embodiment, the collector is a lateral collector portion 60 with no vertical collector component Hence the processing is similar to that as described above in connection with FIG. 13, to provide the lateral collector portion 60. However, unlike the previous embodiments, a collector film stack is not deposited on the substrate. Instead, an extrinsic base film stack 68 consisting of a first thin oxide layer 70, a doped semiconducting layer 72, a second thin oxide layer 74, and a nitride layer 76 are preferably deposited directly on the isolation structures 16, subcollectors 58, and collector 60. The oxide layers 70 and 74 have a thickness preferably ranging from about thirty nanometers to about seventy nanometers. The doped semiconductor layer 72 preferably has a thickness ranging from about one hundred nanometers to about three hundred nanometers. The nitride layer 76 preferably has a thickness ranging from about one hundred and fifty nanometers to about two hundred and fifty nanometers. Conventional semiconductor processing techniques are preferably used to form the extrinsic base film stack 68. The doped semiconductor layer 72 is preferably doped with a dopant material that is oppositely charged from the collector 60, most preferably boron.

Figure 24:
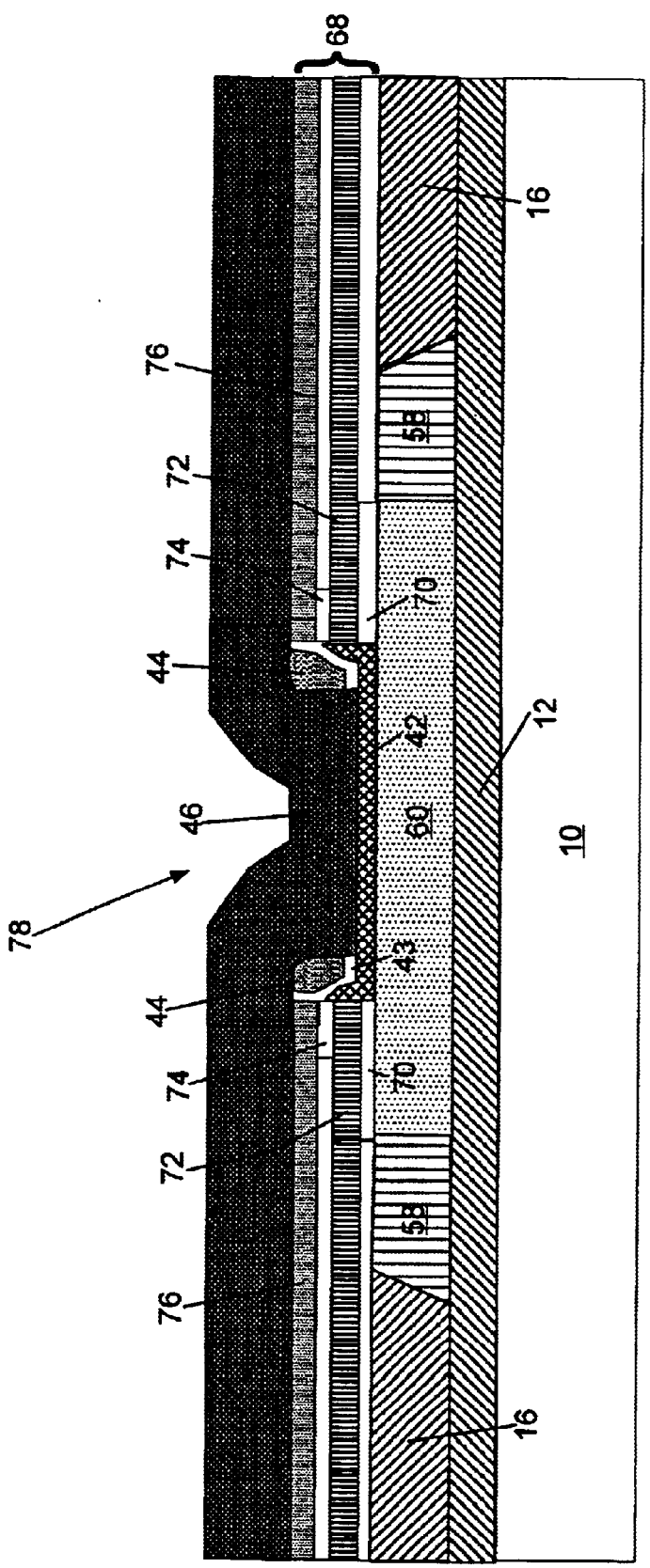

A self aligning collector base and base emitter junction window 78 is etched through the extrinsic base film stack 68 to provide a location for depositing the base 42 and emitter materials, as depicted in FIG. 24. Etching is preferably conducted such as by conventional plasma and chemical etching techniques through layers 70, 72, 74 and 76 so that the base 42 is in direct contact with the collector 60. The base 42 is preferably a doped heterogeneous semiconductor material which is preferably grown by a heteroepitaxial growth technique. In a preferred embodiment, the base 42 is preferably a boron doped silicon germanium alloy base 42. The silicon germanium alloy base 42 preferably has a thickness range from about thirty nanometers to about one hundred nanometers, and the germanium content of the alloy base 42 preferably ranges from about five weight percent to about twenty weight percent.

A third thin oxide layer 43 is deposited on the nitride layer 76 and base 42. A passivation or electrically insulating layer is deposited on the third thin oxide layer 43 to provide self aligning base emitter spacers 44. The spacers 44 are provided by etching the second passivation or insulating layer to remove all of the passivation or insulating layer except for the spacers 44 provided in window 78. The exposed oxide layer 43 is preferably removed from all areas such as by a wet etch technique to provide the spacer structures 44 adjacent the base 42, as shown in FIG. 24. The base emitter spacers 44 are preferably formed of an insulating material such as nitride, preferably silicon nitride. The third thin oxide layer 43 is preferably removed such as by wet etching down to the nitride layer 76.

A semiconductor emitter material is deposited in the collector base and base emitter junction window 78 and on the nitride layer 76 to provide the emitter 46 for the transistor. The semiconductor material for the emitter 46 is preferably an n type polysilicon material that is deposited on the nitride layer 76 with a thickness preferably ranging from about one hundred and fifty nanometers to about two hundred and fifty nanometers. The amount of doping of the polysilicon material to form the emitter 46 preferably ranges from about $10^{20}$ atoms per cubic centimeter to about $10^{21}$ atoms per cubic centimeter. Dopants preferably include arsenic.

Figure 25:
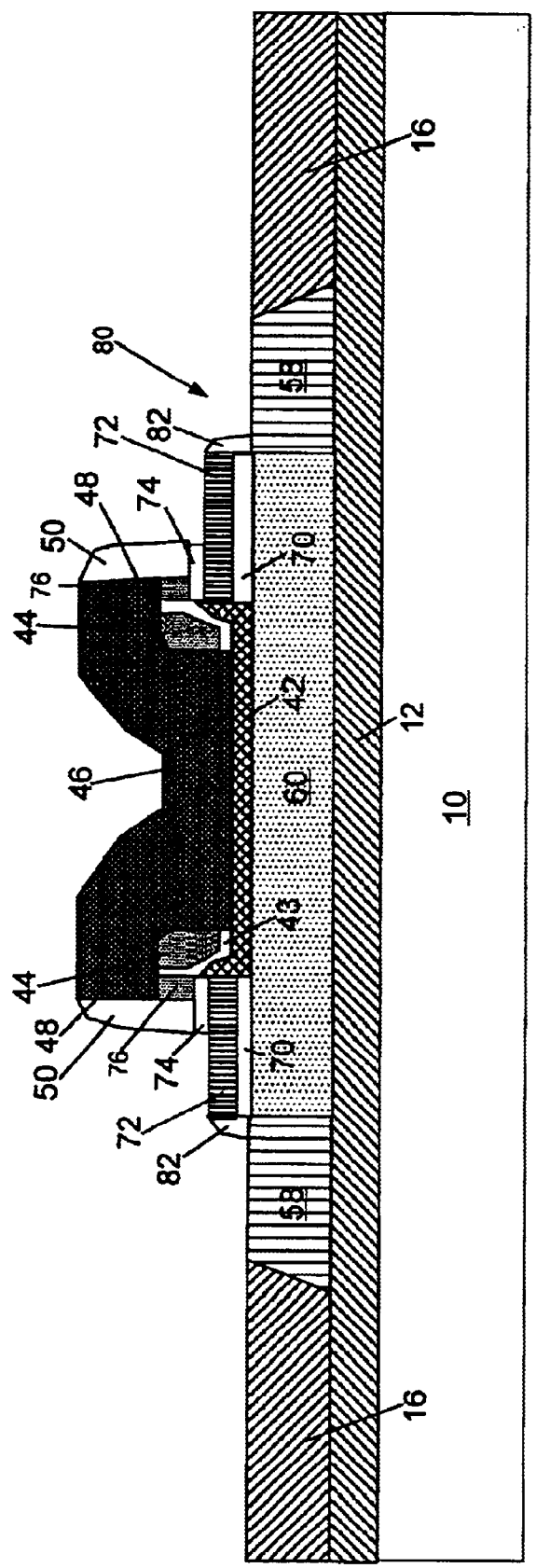

The polysilicon material is masked and etched to provide emitter side walls 48 as shown in FIG. 25, and the exposed nitride layer 76 is etched down to the second thin oxide layer 74. An oxide layer is deposited and etched to form oxide spacers 50 on the emitter walls 48, and any remaining exposed residual portions of the second thin oxide layer 74 are preferably removed such as by wet etching down to the doped semiconducting layer 72, similar to that as described above with reference to FIG. 10.

Figure 26:
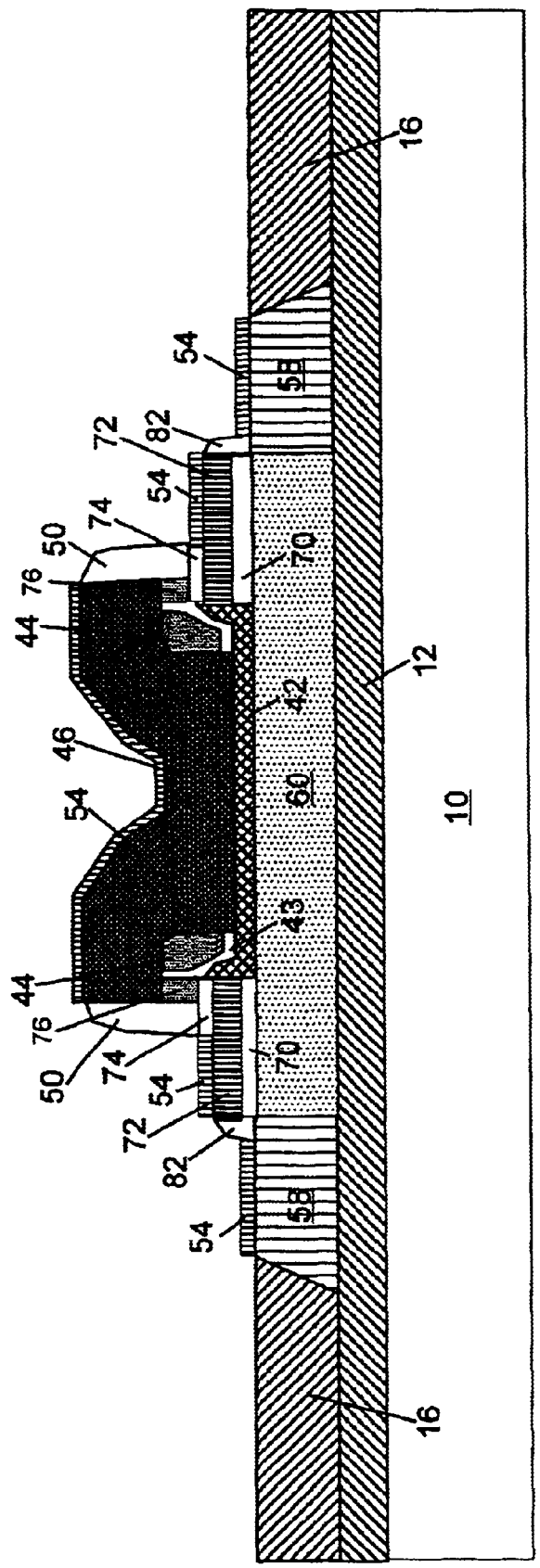

An extrinsic base 80 is defined by masking and dry etching the doped semiconducting layer 72 and the first thin oxide layer 70, exposing the subcollector 58 and isolation structures 16. An oxide is preferably deposited and etched to provide spacers 82 adjacent the etched semiconducting layer 72 and first thin oxide layer 70. Exposed portions of the emitter 46, doped semiconducting layer 72, and subcollector 58 are silicided, similar to that as described above, to provide metal silicide layers 54, for connection to conductor as shown in FIG 26.

It is appreciated that there are many steps that are required to accomplish the processing as described above, and that some intermediate steps, such as patterning and stripping steps, have been omitted. However, those steps which are not completely described above are preferably accomplished according to the processes that are known to be compatible with the materials and processes as described above. Those steps which are not fully described herein have been omitted so as to not unnecessarily encumber this description of the more relevant portions of the invention.

The foregoing embodiments of this invention have been presented purposes of illustration and description They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for making a heterojunction bipolar transistor on an insulated semiconductor substrate so as to minimize collector resistance and collector to substrate capacitance, the method comprising the steps of:

forming a highly doped subcollector in a subcollector region on an insulated substrate;

defining a collector region adjacent the subcollector region;

forming a lightly doped collector adjacent to and in direct contact with the subcollector region;

depositing a doped extrinsic base film stack on the lightly doped collector;

etching a collector base and base emitter junction window in the extrinsic base film stack;

forming a doped semiconductor intrinsic base in the base emitter junction window;

depositing and etching self aligning base emitter spacers in the base emitter junction window;

depositing and etching emitter material in the base emitter junction window; the emiter material having emitter walls;

depositing and etching oxide spacers adjacent the emitter walls of the emitter material;

defining an extrinsic base; and depositing conducting materials on the emitter and extrinsic base.

2. The method of claim 1 wherein the collector and subcollector are disposed laterally adjacent one another between isolation structures.

3. The method of claim 1 wherein the collector comprises a homoepitaxially grown lightly doped collector adjacent a heavily doped silicon subcollector wherein the collector has a polarity similar to a polarity of the subcollector.

4. The method of claim 1 wherein the conducting materials comprise at least one material selected from the group consisting of titanium, tungsten, nickel and cobalt.

5. The method of claim 1 wherein the insulated substrate comprises a silicon on insulator substrate.

6. The method of claim 5 wherein the subcollector is formed between isolation structures.

7. The method of claim 5 wherein the silicon on insulator substrate is highly doped in one region to form the subcollector and lightly doped in a second adjacent region to form a first portion of the collector, a second portion of the collector being formed by homoepitaxially growing the second portion vertically above the first portion.

8. The method of claim 5 where the collector region is defined by a vertical collector film stack above the subcollector region.

9. The method of claim 8 wherein the vertical collector film stack comprises a thin silicon oxide layer adjacent the subcollector layer, a silicon nitride layer adjacent the thin silicon oxide layer and a thick silicon oxide layer adjacent the silicon nitride layer.

10. The method of claim 5 wherein the extrinsic base film stack comprises a fist silicon oxide layer, a polysilicon layer a second silicon oxide layer and a silicon nitride layer.

11. The method of claim 5 wherein the intrinsic base comprises a heteroepitaxially grown doped silicon germanium base.

12. The method of claim 11 wherein the silicon germanium base is doped with boron ions.

13. A silicon germanium heterojunction bipolar transistor made by the method of claim 1.

14. A method for making a heterojunction bipolar transistor on an insulated semiconductor substrate having a collector which minimizes collector resistance and collector to substrate capacitance, the method comprising the steps of:

forming a doped silicon subcollector between shallow trench isolation structures on a silicon oxide insulated silicon wafer;

forming a vertical collector film stack on the subcollector and isolation structures, the vertical collector film stack a thin silicon oxide layer, a silicon nitride layer and a thick silicon oxide layer;

anisotropically etching the thick silicon oxide layer and the silicon nitride layer and wet etching the thin silicon oxide layer to define a collector location therein wherein the collector film stack is etched through to the doped silicon subcollector;

homoepitaxially growing a lightly doped silicon collector in the collector location;

depositing a doped extrinsic base film stack on the doped collector and thick silicon oxide layer;

etching a collector base and base emitter junction window in the extrinsic base film stack;

forming a doped semiconductor intrinsic base in the base emitter junction window;

depositing and etching self aligning base emitter spacer in the base emitter junction window;

depositing and etching a polysilicon emitter in the base emitter junction window, the emitter having emitter walls;

depositing and etching oxide spacers adjacent the emitter walls of the emitter;

defining an extrinsic base; and depositing conducting materials on the emitter and extrinsic base.

15. The method of claim 14 wherein the extrinsic base film stack is doped with boron.

16. The method of claim 14 wherein the collector base comprises a self aligning collector base.

17. The method of claim 14 wherein the collector base comprises a boron doped silicon germanium intrinsic base.

18. The method of claim 14 wherein the base emitter spacer comprises silicon nitride.

19. The method of claim 14 wherein the conducting materials comprise at least one material selected from the group consisting of titanium, tungsten nickel, and cobalt.

20. A silicon germanium heterojunction bipolar transistor made by the method of claim 14.

21. A method for making a heterojunction bipolar transistor on an insulated semiconductor substrate having a collector which minimizes collector resistance and collector to substrate capacitance, the method comprising the steps of:

forming a highly doped silicon subcollector and a lightly doped silicon collector adjacent to and in direct contact with the highly doped silicon subcollector, the high doped silicon subcollector and the highly doped silicon collector disposed between shallow trench isolation structures on a silicon oxide insulated silicon wafer;

depositing an extrinsic base film stack on the lightly doped silicon collector and the highly doped silicon collector;

etching a collector base and base emitter junction window in the extrinsic base as film stack;

forming a dope semiconductor intrinsic base in the base emitter junction window;

depositing and etching self aligning base emitter spacers in the base emitter junction window;

depositing and etching a polysilicon emitter in the base emitter junction window; polysilicon emitter having emitter walls;

depositing and etching oxide spacers adjacent the emitter walls of the emitter;

defining an extrinsic base; and depositing conducting materials on the emitter and extrinsic base.

22. The method of claim 21 wherein the extrinsic base film stack is doped with boron.

23. The method of claim 21 wherein the collector base comprises a self aligning collector base.

24. The method of claim 21 wherein the collector base comprises a boron doped silicon germanium intrinsic base.

25. The method of claim 21 wherein the base emitter spacer comprises silicon nitride.

26. The method of claim 21 wherein the conducting materials comprise at least one material selected from the group consisting of titanium, tungsten, nickel, and cobalt.

27. A silicon germanium heterojunction bipolar transistor made by the method of claim 21.

28. A method for making a heterojunction bipolar transistor on an insulated semiconductor substrate having a collector which minimizes collector resistance and collector to substrate capacitance, the method comprising the steps of:

forming a highly doped silicon subcollector and a lightly doped silicon collector adjacent to and in direct contact with the highly doped silicon subcollector, the highly doped silicon subcollector and the lightly doped silicon collector disposed between shallow trench isolation structures on a silicon oxide insulated silicon wafer;

forming a vertical collector film stack on the highly doped silicon subcollector the doped silicon collector, and isolation structures, the vertical collector film stack including a thin silicon oxide layer, a silicon nitride layer and a thick silicon oxide layer;

anisotropically etching the thick silicon oxide layer and the silicon nitride layer and wet etching the thin silicon oxide layer to define a collector location therein, wherein the collector film stack is etched through to the collector;

homoepitaxially growing a lightly doped silicon collector in the collector location;

depositing an extrinsic base film stack on the lightly doped silicon collector and the vertical collector film stack;

etching a collector base and base emitter junction window in the extrinsic base film stack;

forming a doped semiconductor intrinsic base in the base emitter junction window;

deposing and etching self aligning base emitter spacers in the base emitter junction window;

depositing and etching a polysilicon emitter in the base emitter junction window, polysilicon emitter having emitter;

depositing and etching oxide spacers adjacent the emitter walls of the emitter;

defining an extrinsic base; and depositing conducting materials on the emitter and extrinsic base.

29. The method of claim 28 wherein the extrinsic base film stack is doped with boron.

30. The method of claim 28 wherein the collector base comprises a self aligning collector base.

31. The method of claim 28 wherein the collector base comprises a boron doped silicon germanium intrinsic base.

32. The method of claim 28 wherein the base emitter spacer comprises silicon nitride.

33. The method of claim 28 wherein the conducting materials comprise at least one material selected from the group consisting of titanium, tungsten, nickel, and cobalt.

34. A silicon germanium heterojunction bipolar transistor made by the method of claim 28.

* * * * *